United States Patent [19]

Bottomley et al.

[11] Patent Number: 4,689,563

[45] Date of Patent: Aug. 25, 1987

[54] HIGH-FIELD NUCLEAR MAGNETIC RESONANCE IMAGING/SPECTROSCOPY SYSTEM

[75] Inventors: Paul A. Bottomley, Clifton Park; William A. Edelstein, Schenectady; Howard R. Hart, Jr., Schenectady; John F. Schenck, Schenectady; Rowland W. Redington, Schenectady; William M. Leue, Albany, all of N.Y.

[73] Assignee: General Electric Company, Schenectady, N.Y.

[21] Appl. No.: 743,125

[22] Filed: Jun. 10, 1985

[51] Int. Cl.$^4$ ................................. G01R 33/20
[52] U.S. Cl. ................................................. 324/309
[58] Field of Search ....................................... 324/309

[56] References Cited

U.S. PATENT DOCUMENTS

| | | | |
|---|---|---|---|
| 4,319,190 | 3/1982 | Brown | 324/313 X |
| 4,443,760 | 4/1984 | Edelstein et al. | 324/309 |
| 4,472,683 | 9/1984 | Seikhara et al. | 324/309 |
| 4,553,096 | 11/1985 | Randell | 324/309 |
| 4,558,279 | 12/1985 | Ackerman et al. | 324/315 |
| 4,567,440 | 1/1986 | Haselgrove | 324/309 |
| 4,602,641 | 7/1986 | Feinberg | 324/309 X |
| 4,617,516 | 10/1986 | Schenck | 324/309 X |
| 4,618,827 | 10/1986 | Redington et al. | 324/309 |
| 4,621,235 | 11/1986 | Van Uijen et al. | 324/309 X |

OTHER PUBLICATIONS

"NMR: An Evolving Technology", brochure, General Electric Co. (1983), 8 pages.
"Radiology-69th Scientific Assembly & Annual Meeting, Chicago Nov. 13, 1983", brochure General Electric Co. (1983), 4 pages.
"SIGNA—The Signature of Excellence in MR Imaging", brochure, General Electric Co., Nov. 1983, pp. 1-10.
"Anatomy and Metabolism of the Normal Human Brain Studied by Magnetic Resonance at 1.5 Tesla", PA Bottomley et al., 150 Radiology 441-446 (Feb. 1984).
"Radiology—70th Scientific Assembly Annual Meeting, Washington, D.C., Nov. 25-30, 1984," brochure, General Electric Company, 1984; 7 pages.

Primary Examiner—Tom Noland
Attorney, Agent, or Firm—Geoffrey H. Krauss; James C. Davis, Jr.; Marvin Snyder

[57] ABSTRACT

A magnetic resonance system for both imaging and spectroscopy of a sample of non-magnetic material (such as a portion of the human anatomy and the like) at one static magnetic field magnitude in excess of 0.7 Tesla (T), utilizes a superconducting magnet having a room-temperature bore of diameter sufficiently large to place therein not only the desired sample but also a set of gradient magnetic field-producing coils and at least one radio-frequency coil for exciting and/or receiving response signals from the sample to be examined. The entire magnetic system has suitably-small temporal and positional field variations to allow imaging to be accomplished at the resonant frequencies of nuclei including $^1H$, $^{13}C$, $^{19}F$, $^{23}Na$ and $^{31}P$. The system includes a novel interface subsystem, itself including a novel gradient signal switching circuit, for acquiring imaging data in relatively short time intervals.

15 Claims, 21 Drawing Figures

| #GS ⎍ LONG | SHORT | $G'_X$ | $G'_Y$ | $G'_Z$ | EFFECT ON $G_{out}$ | IMAGE-SLICE DIRECTION e.g. |
|---|---|---|---|---|---|---|
| 0 | 0 | | | | NONE | AS PREVIOUSLY COMMANDED |
| 1 | 1 | $G_X$ | $G_Y$ | $G_Z$ | RESET TO "NORMAL" | AXIAL-NORMAL |
| 1 | 2 | $G_Z$ | $G_X$ | $G_Y$ | ROTATE "RIGHT" | SAGITTAL-NORMAL |
| 1 | 3 | $G_Y$ | $G_Z$ | $G_X$ | ROTATE "LEFT" | CORONAL-NORMAL |
| 1 | 4 | $G_Z$ | $G_Y$ | $G_X$ | SWAP X & Z | SAGITTAL-ROTATED |
| 1 | 5 | $G_X$ | $G_Z$ | $G_Y$ | SWAP Y & Z | CORONAL-ROTATED |
| 1 | 6 | $G_Y$ | $G_X$ | $G_Z$ | SWAP X & Y | AXIAL-ROTATED |

ASSEMBLE FIG.s 2a THRU 2d AS SHOWN

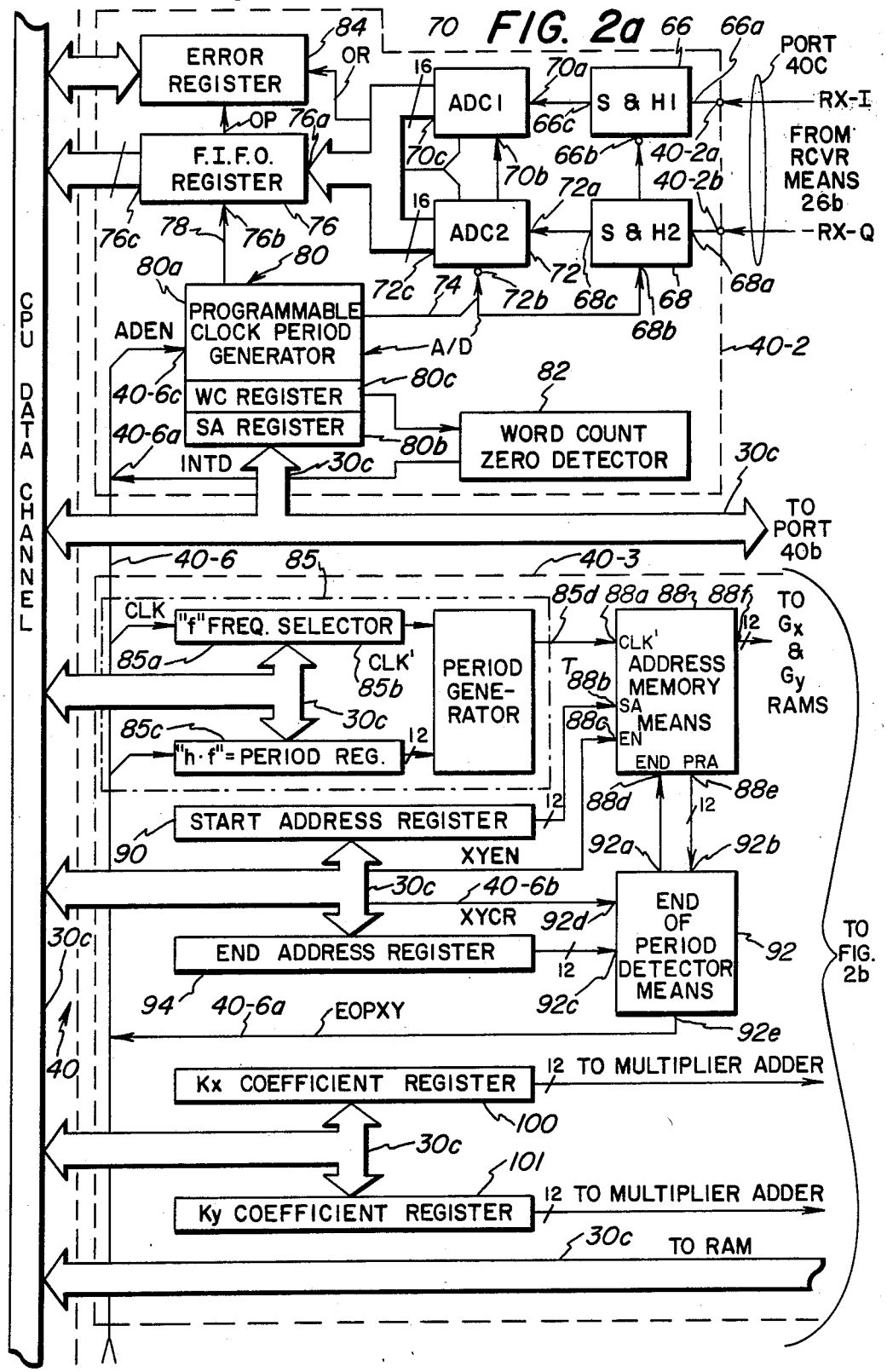

| MASTER SEQUENCER PERIOD GENERATOR FIELD bits b0-b15 | ENABLE, INT, SYNCH, ETC. FIELD bits b16-b23 | NEXT ADDRESS FIELD bits b24-b31 | Z1 GENERATOR MEANS & GATES 1-3 CONTROL FIELD bits b32-b47 | Z2 GENERATOR MEANS & GATES 4-6 CONTROL FIELD bits b48-b63 |
|---|---|---|---|---|

MICRO CODE DATA WORD FORMAT

FIG. 3a

| #GS LONG | SHORT | $G'_X$ | $G'_Y$ | $G'_Z$ | EFFECT ON $G_{out}$ | IMAGE-SLICE DIRECTION e.g. |
|---|---|---|---|---|---|---|
| 0 | 0 | | | | NONE | AS PREVIOUSLY COMMANDED |
| 1 | 1 | $G_X$ | $G_Y$ | $G_Z$ | RESET TO "NORMAL" | AXIAL-NORMAL: Y↑ →X |
| 1 | 2 | $G_Z$ | $G_X$ | $G_Y$ | ROTATE "RIGHT" | SAGITTAL-NORMAL: Y↑ →Z |
| 1 | 3 | $G_Y$ | $G_Z$ | $G_X$ | ROTATE "LEFT" | CORONAL-NORMAL: Z↑ →X |
| 1 | 4 | $G_Z$ | $G_Y$ | $G_X$ | SWAP X & Z | SAGITTAL-ROTATED: Z↑ →Y |
| 1 | 5 | $G_X$ | $G_Z$ | $G_Y$ | SWAP Y & Z | CORONAL-ROTATED: X↑ →Z |
| 1 | 6 | $G_Y$ | $G_X$ | $G_Z$ | SWAP X & Y | AXIAL-ROTATED: X↑ →Y |

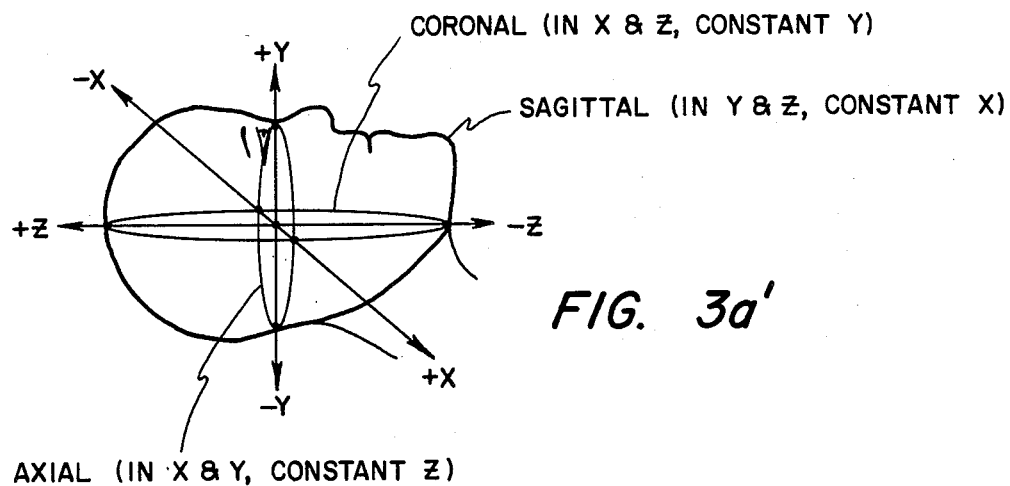

FIG. 3a'

CORONAL (IN X & Z, CONSTANT Y)
SAGITTAL (IN Y & Z, CONSTANT X)
AXIAL (IN X & Y, CONSTANT Z)

HIGH-FIELD NUCLEAR MAGNETIC RESONANCE IMAGING/SPECTROSCOPY SYSTEM

RELATED APPLICATIONS

This application is related to co-pending application Ser. Nos. 714,405 (allowed) and 714,406 (now U.S. Pat. No. 4,602,226, issued July 22, 1986), both filed Mar. 21 1985, and Ser. Nos. 743,119, 743,115 (allowed), 743,121 (allowed), and 743,114 (to be U.S. Pat. No. 4,667,159 on May 19, 1987), filed on even date herewith, all assigned to the assignee of the present application and all incorporated by reference herein in their entireties.

BACKGROUND OF THE INVENTION

The present invention is directed to nuclear magnetic resonance imaging and spectroscopy systems and, more particularly, to a novel imaging and spectroscopic nuclear magnetic resonance (NMR) system having a static magnetic field strength in excess of 0.7 Tesla (T), and to methods for the production of images and localized chemical-shift spectra from anatomical samples, such as the head, limbs and body of human beings.

The nuclear magnetic resonance phenomenon occurs in atomic nuclei having an odd number of protons and/or neutrons. Each such nucleus has a net magnetic moment such that when placed in a static homogeneous magnetic field, denoted $B_0$, a greater number of the involved nuclei become aligned with the $B_0$ field to create a net magnetization, denoted M, in the direction of the $B_0$ field. The net magnetization M is the summation of the individual nuclear magnetic moments. Because a nuclear magnetic moment is the result of a nuclear spin, the terms "nuclear moment" and "nuclear spin" are generally used synonymously in the art.

Under the influence of the static homogeneous magnetic field $B_0$, the nuclei precess, or rotate, about the axis of the $B_0$ field and hence the net magnetization M is aligned with the $B_0$ field axis. The rate, or frequency, at which the nuclei precess is dependent upon the strength of the total magnetic field applied to a particular nucleus, and upon the characteristics of the nuclei specie being subjected to the total magnetic field. The angular frequency of precession, $\omega$, is defined as the Larmor frequency, in accordance with the equation: $\omega = \gamma B_0$, wherein $\gamma$ is the gyromagnetic ratio (and is constant for each nucleus type) and $B_0$ is the strength of the total applied magnetic field to the particular nucleus. Thus, the frequency at which the nuclei precess is primarily dependent upon the strength of the total magnetic field $B_0$; the Larmor frequency increases with increasing total magnetic field strength.

A precessing nucleus is capable of resonantly absorbing electromagnetic energy. The frequency of the electromagnetic energy needed to induce resonance is the same Larmor frequency as the precession frequency $\omega$. During the application of electromagnetic energy, typically by a pulse of radio-frequency (RF) energy, the net magnetization M precesses further away from the $B_0$ field axis (arbitrarily assumed to be the Z-axis of a Cartesian coordinate system), with the amount of precession dependent upon the energy and duration of the RF pulse. A "90°" pulse is defined as that pulse of RF energy causing the magnetization M to nutate through an angle of 90° from the direction of the $B_0$ magnetic field, e.g. to move into the X-Y plane (defined by the X-axis and the Y-axis in the Cartesian coordinate system in which the $B_0$ field is aligned along the Z-axis). Similarly, a "180°" RF pulse is defined as that pulse which causes the magnetization M to reverse direction, i.e. move through an angle of 180°, from its original direction (e.g. from the positive Z-axis to the negative Z-axis direction). Following the excitation of the nuclei with RF energy, the absorbed energy is re-radiated as an NMR response signal, as the nuclei return to equilibrium. The re-radiated energy is both emitted as radio waves and transferred to molecules, of the sample being investigated, surrounding each re-radiating nucleus.

NMR response signals originating at different spatial locations within the sample can be distinguished by causing their respective resonant frequencies to differ in some predetermined manner. If one or more magnetic field gradients are applied to the sample, and if each gradient field is of sufficient strength to spread the NMR response signal spectra in a predetermined manner, then each nuclear spin along the direction of at least one of the field gradients experiences magnetic field strength different from the magnetic field strength experienced by other nuclear spins, and therefore resonates at a Larmor frequency different from that of other nuclear spins, as predicted by the Larmor equation. Spatial position of each nucleus contributing to the total NMR response signal can be determined by Fourier analysis, when coupled with knowledge of the applied magnetic field gradient configuration.

The return of nuclear spins to equilibrium, following RF excitation, is referred to as "relaxation". The relaxation process is characterized by two time constants, $T_1$ and $T_2$, both of which are measures of motion on the molecular level. The spatial distribution of the $T_1$ and $T_2$ constants throughout the sample provides information as to the coupling, or interaction, of the nuclei with their surroundings ($T_1$) or with each other ($T_2$) and both provide useful imaging information.

The time constant $T_1$ is referred to as the "longitudinal", or "spin-lattice", NMR relaxation time, and is a measure of time required for the magnetization M to return to equilibrium; that is, time constant $T_1$ measures the tendency of the nuclear spins to realign themselves with the total field $B_0$, after cessation of RF excitation which has moved the spins away from the $B_0$ field direction. The rate of return to equilibrium is dependent upon how fast the stimulated nuclei can transfer energy to the surrounding sample material, or sample lattice. Time constant $T_1$ can, for proton ($^1H$) NMR, vary from a few milliseconds in liquids to several minutes or hours in solids. In biological tissue, the typical range of time constant $T_1$ is from about 30 milliseconds to about 3 seconds.

The time constant $T_2$ is referred to as the "transverse", or "spin-spin", relaxation time and is a measure of how long the excited nuclear spins oscillate in phase with one another. Immediately after an RF excitation pulse, the nuclear spins are in phase and precess together; however, each nuclear spin behaves like a magnet which generates a magnetic field that affects other spinning nuclei in its vicinity (generating spin-spin interaction). As each nuclear moment experiences its own slightly different magnetic field, due to the spin of adjacent nuclei, that magnetic moment will precess at a different rate and dephase with respect to the other spins, thereby reducing the observable NMR response signal with a time constant $T_2$. Time constant $T_2$ can vary from a few microseconds in solids to several seconds in liquids, and is always less than or equal to time constant $T_1$. In biological tissue, the typical range of time constant $T_2$, for $^1H$ NMR, is from about 5 milliseconds to about 3 seconds.

If the static magnetic field $B_0$ itself has inherent inhomogeneities, as is typically the case with a field generated by a practical magnet, these inherent inhomogeneities produce additional dephasing action, which hastens the decay of the NMR signal. This additional dephasing action occurs because nuclear spins in different spatial locations are exposed to slightly different magnetic field values and therefore resonate at slightly different frequencies. This new relaxation time, which includes the effects of magnetic inhomogeneities, is generally designated $T_2^*$ ($T_2$ star), where $T_2^* \leq T_2$.

In addition to the effect of spin time constants upon the magnitude of the RF energy re-radiated from a particular nuclei, the frequency of the RF electromagnetic energy re-radiated from any particular nuclei can also be affected by local chemical shifts. Chemical shifts occur where the NMR frequency of resonant nuclei, of the same type in a given molecule, differ because of the different magnetic environments, which are themselves produced by differences in the chemical environment of each of the multiplicity of nuclei. This chemical environment difference may occur, for example, due to electrons partly screening the nucleus of a particular atom from the magnetic field; the nucleus therefore has a somewhat-reduced resonant frequency due to the somewhat-reduced total magnetic field to which that nucleus is subjected. The degree of shielding caused by electrons depends upon the total environment of the nucleus, and therefore the chemical-shift spectrum of a given molecule is unique and can be utilized for identification. Because the resonant frequency (and therefore the absolute chemical shift) is dependent upon the strength of the total applied field, the chemical-shift spectrum is generally expressed as a fractional shift, in parts-per-million (ppm), of the NMR frequency, relative to an arbitrary reference compound. Illustratively, the range of chemical shifts is about 10 ppm for protons ($^1H$) to about 200 ppm for carbon ($^{13}C$); other nuclei of interest, such as phosphorous ($^{31}P$) for example, have intermediate chemical shift ranges, e.g. 30 ppm. In order to perform chemical-shift spectroscopy, in which such small chemical shifts are discernible, the homogeneity of the static $B_0$ magnetic field must be better than the differences in chemical shifts of the spectral peaks to be observed, and is typically required to be much better than one part in $10^6$ (1 ppm).

Thus, nuclear magnetic resonance investigation offers two non-invasive probes for detection and diagnosis of disease states in an organic sample: proton ($^1H$) magnetic resonance imaging, which can provide images of the internal human anatomy with excellent soft-tissue contrast brought about by the relatively large differences in NMR relaxation times; and localized phosphorous ($^{31}P$) and carbon ($^{13}C$) chemical-shift spectroscopic imaging to provide direct access to metabolic processes for the assessment of damaged tissue and its response to therapy. In addition, the feasibility of imaging natural-abundance sodium ($^{23}Na$) and artifically introduced fluorine ($^{19}F$) has recently been demonstrated; clinical applications may occur in the near future. It is well known that the magnetic field requirements for $^1H$ imaging can be met at static field strengths below 0.5 Tesla (T) and that spectroscopy typically requires aa magnetic field strength in excess of 1 T, with a much higher degree of homogeneity across the examination region than required for imaging. It is also well known that the signal-to-noise ratio of the NMR signal improves with increasing magnetic field strength, if the rest of the NMR system is optimized. It has been widely speculated, in the literature of the art, that human head and body proton imaging is not feasible above a main field strength of about 0.5 T, owing to the dual problems of RF field penetration into the sample to be investigated and to the difficulty of NMR coil design, at the relatively high NMR frequencies associated with the higher-magnitude static fields. Therefore, by at least implication, a single magnetic resonance system having a single high magnetic field magnitude, in excess of about 0.7 T, for producing proton images and localized chemical-shift spectra from anatomical samples, such as the head, limbs and body of human beings, has been considered experimentally incompatible. A system enabling the performance of both high-field NMR imaging (for nuclei including at least $^1H$, $^{19}F$ and $^{23}Na$) and chemical-shift spectroscopy (for nuclei including at least $^1H$, $^{13}C$, $^{23}Na$ and $^{31}P$) for medical applications with the human body, and for the analysis distribution of non-ferromagnetic samples (e.g. for analysis and distribution of hydrocarbon deposits and oil-bearing shale sediments, for plant root and stem systems, for general morphological and chemical analysis of heterogeneous non-ferromagnetic samples, and the like) is highly desirable.

BRIEF SUMMARY OF THE INVENTION

In accordance with the invention, a novel high-field nuclear magnetic resonance system for the production of images and localized chemical-shift spectra from a non-ferromagnetic sample, such as anatomical portions of human beings and the like, comprises: means, such as a superconducting magnet and the like, for generating a static magnetic field, along a first designated axis of a Cartesian coordinate system, of magnitude between about 0.7 T and about 4 T, with static field variations, across an imaging volume within the bore of the magnet means, of less than about 3 parts per million and a temporal stability of less than about 1 ppm-per-hour for imaging and spectroscopy, said magnetic means having a room-temperature free bore of diameter greater than about 0.4 meters and less than about 1.5 meters; means suitable for the generation of pulsed linear magnetic gradient fields in the main applied static field, relative to the three principle Cartesian coordinate axes, within the magnetic means bore; means for providing an RF magnetic field within the magnetic means bore and in the sample, responsive to a modulated radio-frequency excitation signal; means for receiving radio-frequency energy re-radiated from the sample for forming a response signal; spectrometer means for providing the excitation signal with desired amplitude, frequency, phase and the like characteristics, for providing at least one referemce signal for obtaining phase information, noise reduction and/or coherent detection, and for converting the received response signal to at least one video signal for analysis; and means for controlling the characteristics of the magnetic field gradient signals and the excitation signal and for analyzing the received response signal to provide a human-viewable display of the magnetic resonance imaging and chemical-shift spectroscopy information obtained by the examination of the sample to be investigated.

Other aspects of our invention include the methods for applying specific combinations of radio-frequency and magnetic gradient field signals for the production of two-dimensional (single-slice) and three-dimensional multiple-slice) images, transverse and relaxation time images and chemical-shift spectroscopic images of $^1H$, $^{13}C$, $^{23}Na$ and/or $^{31}P$ nuclei and the like.

In a presently preferred embodiment of our system, having a highly-homogeneous static magnetic field of about 1.5 T (about 15,000 gauss) generated by a superconducting magnet having windings maintained at liquid helium temperature (about 4° K.), we have obtained high quality images and excellent hydrogen, phosphorous and carbon spectra from volunteer human subjects. The relatively high strength of our superconducting magnet means provides an increased signal-to-noise ratio for both proton images and chemical-shift spectral images. The magnetic field magnitude is at, or above, current upper limits generally believed possible for generation of NMR proton images and is at, or below, the lower limit of magnetic field magnitude generally accepted to be necessary for obtaining chemical-shift spectra. In addition, the high-magnitude, high-stability magnetic field is obtained in a magnet means room-temperature free bore of sufficient diameter to provide a volume large enough to include the sample (the patient) to be investigated, sample-holding apparatus (such as a patient-bearing table and the like), RF and gradient field coils and the like, and still have sufficient free space outside these coils to allow return paths for the magnetic flux generated by the coils. The approximately 1 meter diameter bore of our magnet means, defined by a glass-reinforced plastic tube which serves as the innermost wall of the cryostat containing a superconductive winding, is lined with a non-magnetic stainless steel foil (type 347 of about 0.05 millimeter thickness) to shield the RF coils from outside radio-frequency interference. The foil is thin enough to allow the relatively low-frequency pulsed magnetic gradient fields to penetrate therethrough, to a 1-centimeter-thick pure aluminum tube which serves as the conductive barrier for the gradient magnetic fields. This highly-conductive tube, cooled to liquid nitrogen temperatures (about 77° K.), minimizes the coupling between the pulsed-gradient field coils and the superconductive magnetic field windings, as too strong a coupling therebetween can lead to unwanted quenches in, or loss of the field of, the superconducting magnet. The magnetic field provided by our system's magnet means is highly homogeneous over the region of the sample to be studied: for a 30-centimeter diameter imaging sphere, our field is homogeneous within about 1.7 ppm, while a homogeneity of better than about 0.05 parts per million is achieved over a 10-centimeter diameter spherical volume useful for chemical-shift spectroscopy. While these homogeneities are measured in the absence of human bodies, and the human body is known to be weakly magnetic and capable of distorting the field homogeneity, a set of a plurality of superconductive shim coils and another set of a plurality of resistive shim coils allows correction of a large number of terms in the spherical harmonic expansion of the inhomogeneity of the static magnetic field to regain at least the required degree of homogeneity, even in the presence of the weakly-magnetic-sample distorting field.

Our system employs three time-dependent orthogonal magnetic gradient fields to encode three-dimensional spatial information into the system imaging signal sequences. The gradient magnetic fields are coincident with the Cartesian coordinate axes of a coordinate system having its positive Z-axis coincident with the cylindrical axis of the main field magnet and with an origin at the center of the magnet, which origin is assumed to be the center of the imaging sphere. Radio-frequency magnetic field pulses used to excite the nuclear magnetic resonance signal, consist of a radio-frequency carrier signal at exactly the Larmor frequency of the bulk of the sample, which carrier frequency signal is amplitude-modulated to produce specific pulse shapes, as required by the various imaging and spectroscopy sequences. The RF excitation and reception coils are so oriented as to align the radio-frequency magnetic fields thereof in a plane orthogonal to the Z-axis direction of the main magnetic field.

In accordance with other aspects of our high-field nuclear magnetic resonance system, imaging is accomplished by use of a variety of methods, including partial-saturation two-dimensional (2D) spin-warp imaging, inversion-recovery 2D spin-warp imaging, multiple-echo 2D spin-warp imaging, restricted three-dimensional (3D) spin-warp imaging, and two-dimensional chemical-shift spectroscopic imaging, amongst other imaging methods.

Accordingly, it is one object of the present invention to provide a novel nuclear magnetic resonance system and methods for enabling the production of both nuclear magnetic resonance images and localized chemical-shift spectra in a stable static magnetic field having a single magnitude.

This and other objects of the invention will become apparent to those skilled in the art, upon a perusal of the following detailed description, when considered in conjunction with the drawings.

BRIEF SUMMARY OF THE DRAWINGS

FIG. 3a is a table useful in appreciating the operational characteristics of the gradient drive switching means of FIG. 3;

FIG. 3a' is a perspective view of a model of a human head, defining the axial, coronal and sagittal slice directions, and useful in appreciating the operation of the present invention;

DETAILED DESCRIPTION OF THE INVENTION

The NMR System

Figure 1:
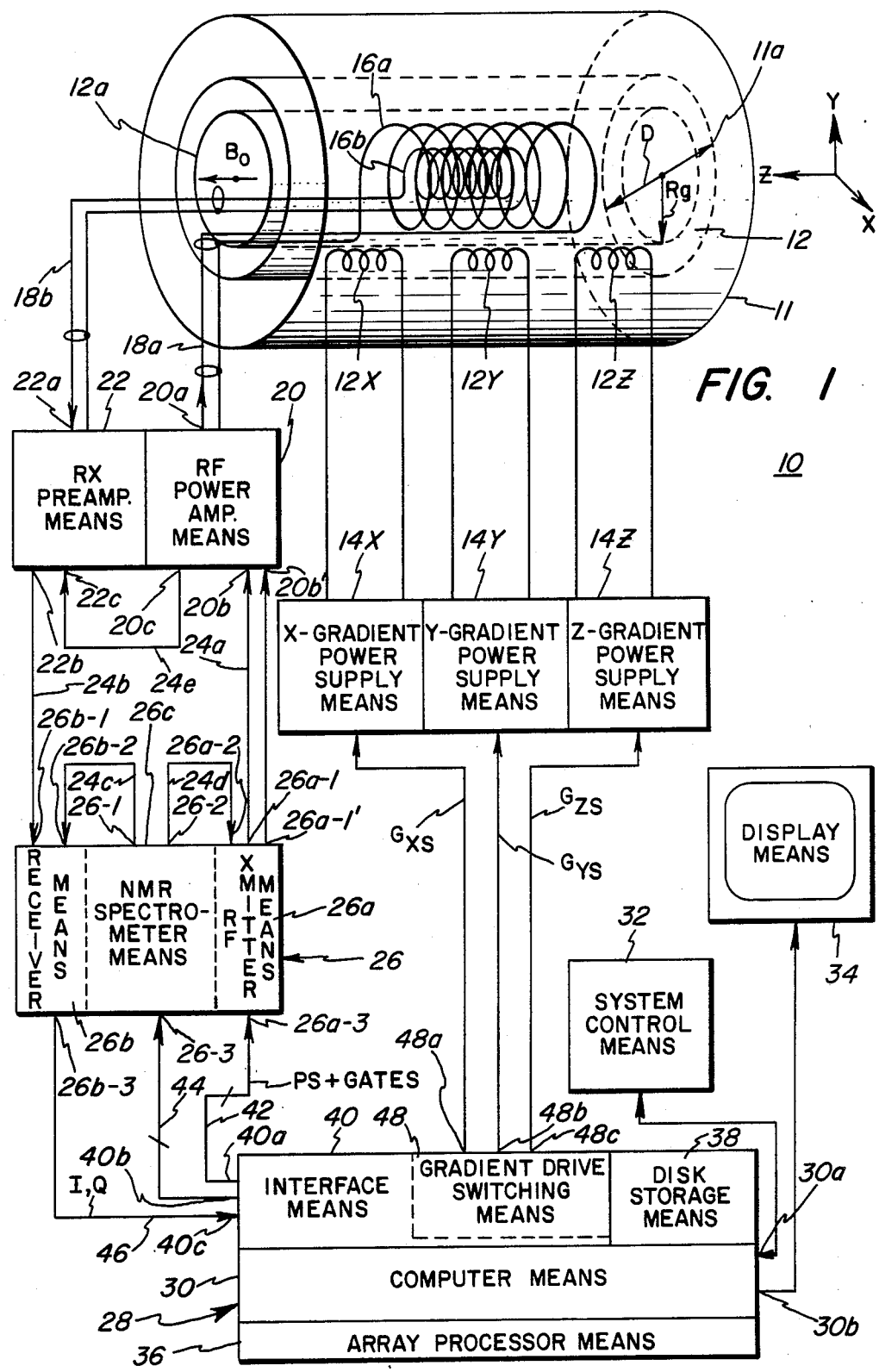
FIG. 1 is a schematic block diagram of an NMR system, in accordance with the principles of the present invention.
Figure 1A:
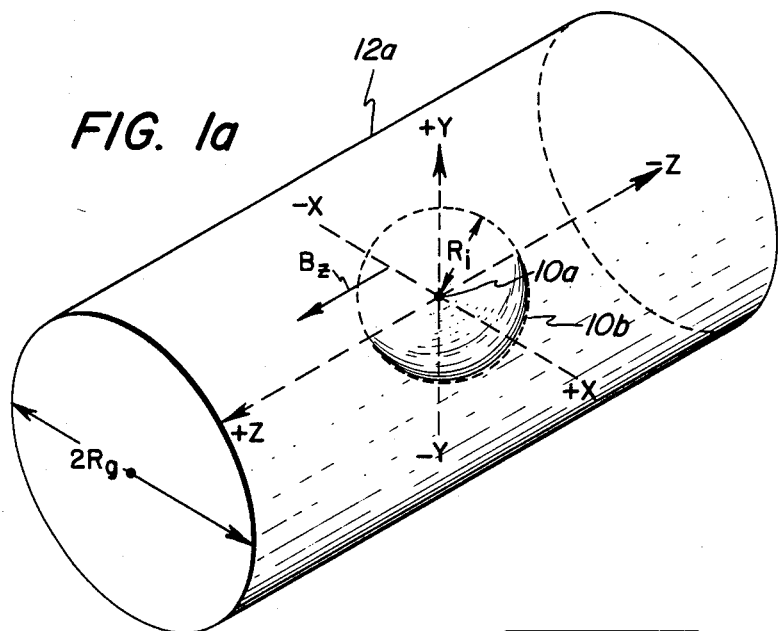
FIG. 1a is a perspective view of the bore of the NMR system magnet means, defining the various imaging coordinates and volumes.

Referring initially to FIGS. 1 and 1a, a magnetic resonance imaging and spectroscopy system 10 utilizes a superconducting magnet means 11 having a room-temperature inner bore 11a of a diameter D, between about 0.4 meters and about 1.5 meters. Magnet means 11 provides a single static magnetic field $B_0$ along the axis of the cylindrical bore 11a; the magnitude of field $B_0$ must be sufficiently high, i.e. not less than about 0.7 Tesla (T), to facilitate production of localized chemical-shift spectra and has an upper limit, i.e. presently about 4 T, established only by available magnet technology for providing a high-field magnet having a useable bore diameter D. By way of example only, magnet means 11 may be a superconducting magnet, available from Oxford Instruments Co. of England, having main magnet coils and a set of a plurality, e.g. 12, of correction coils immersed in liquid helium, with another set of a plurality, e.g. 10, of resistive correction coils. The magnet means has a bore provided by a non-conductive tube, e.g. of fiberglass and the like, which is lined with a thin cylinder of a conductive material, e.g. stainless steel and the like, to provide shielding for the RF magnetic fields. The resulting room-temperature free bore 11a has a diameter D of about 1 meter. An axial static field $B_0$ of high spatial and temporal linearity and stability is provided at a magnitude of about 1.5 T. The static magnetic field $B_0$ is assigned to the Z axis of a three-dimensional Cartesian coordinate system, wherein the X and Y directions are orthogonal to one another and to the Z axis.

Within the magnet means free bore 11a are gradient coil means for generating a set of linear magnetic field gradients in the main static $B_0$ field, relative to the three principal Cartesian coordinate axes. Gradient coil means 12 are typically confined to an annular cylindrically-shaped volume, having a gradient coil means free bore 12a, with a gradient bore radius $R_g$ which is less than the magnet means inner bore radius (i.e. $R_g$ is less than D/2) but is typically not less than about 0.3 meters. Within the annular cylindrical volume, disposed with its axis along the Z axis of the magnet means free bore, are disposed suitable means for providing a magnetic field gradient in each of the three Cartesian coordinate axes; the three gradient field-forming means are schematically illustrated as coil means 12X for forming a magnetic field gradient $G_X(=\partial B_0/\partial x)$ relative to the X coordinate axis, coil means 12Y for forming a magnetic field gradient $G_Y(=\partial B_0/\partial y)$ relative to the Y coordinate axis, and coil means 12Z for forming a magnetic field gradient $G_Z(=\partial B_0/\partial z)$ relative to the axial Z coordinate axis. While coil means 12X, 12Y and 12Z are schematically shown as having common axes, it should be understood that this positioning is for purposes of diagrammatic simplicity only; the actual position and type of gradient field generating means (which may be coils having saddle-shaped, Maxwell pair, or other distributed current winding geometries such as are disclosed, inter alia, in co-pending patent applications (Ser. Nos. 529,431 (now U.S. Pat. No. 4,617,516, issued Oct. 14, 1986) 548,041 (now abandoned); 548,174 (now U.S. Pat. No. 4,646,024, issued Feb. 24, 1987); 612,966 (now U.S. Pat. No. 4,506,247, issued Mar. 19, 1985); 628,076 (now U.S. Pat. No. 4,509,030, issued Apr. 21, 1985); 628,077 (now U.S. Pat. No. 4,500,860, issued Feb. 19, 1985) and 662,744 (now U.S. Pat. No. 4,523,166, issued June 11, 1985), respectively filed Sept. 6, 1983; Nov. 2, 1983; Nov. 2, 1983; May 23, 1984; May 5, 1984; May 5, 1984 and Oct. 19, 1984, assigned to the assignee of the present application and incorporated herein in their entirety by reference) is well known to the magnetic resonance imaging art. The only requirement of gradient coil means 12X, 12Y and 12Z is that the means utilized be capable of generating magnetic field gradients in the main applied field $B_0$, which magnetic field gradients may be linear, or otherwise, with respect to the Cartesian coordinate axis associated with each gradient coil means and which magnetic field gradient may be pulsed, or otherwise modulated, as required for the particular magnetic resonance experiment to be conducted.

The magnet means 11 and gradient coil means 12 thus provide a total magnetic field $B_Z$ (FIG. 1a) within the gradient coil means free bore 12a, which total field $B_Z$ is a summation of four separate fields: the static field $B_0$ in the Z axial direction, and gradient fields in the X, Y and Z directions which typically vary linearly with distance along the associated axis. Thus, the total $B_Z$ field is given by:

$$B_Z = B_0 + G_X \cdot x + G_Y \cdot y + G_Z \cdot z,$$

where $G_X = (\partial B_Z/\partial x)$, $G_Y = (\partial B_Z/\partial y)$ and $G_Z = (\partial B_Z/\partial z)$, and where $G_X$, $G_Y$ and $G_Z$ can be of either polarity. The origin 10a of the Cartesian coordinate system is usually chosen as the center of the region of highest homogeneity of the main static field $B_o$. As shown in FIG. 1a, this point usually corresponds substantially to the midpoint along the length of the bore in each of the three Cartesian directions, although it should be understood that, by variation of the ratios of the currents in different portions of each of the $G_x$, $G_y$ and $G_z$ gradient coil means, the center 10a of a sample sphere 10b can be moved to any desired location within the imaging cylinder 12a. It is also possible, and may even be preferable, to acquire data from different regions with imaging cylinder 12a, without shifting the sampling sphere center $10_a$, by altering the ratios of current, or otherwise, in the gradient coil means. Such data acquisitions can be implemented by offsetting the NMR excitation frequency W to correspond to a particular $B_z$ value at preselected locations (x, y, z), lying in a plane parallel to the net gradient magnetic field represented by the applied $G_x$, $G_y$ and $G_z$ gradients, in accordance with the Larmor equation ($w = \gamma B_z$). Such techniques enable sampling spheres to be moved to various locations, when it is not convenient or possible, for any reason, to move the anatomical sample (a human body and the like) in any one of the X, Y or Z directions to place the sampling volume at the sample sphere center point 10a. The sample sphere 10b has a radius $R_i$ determined by the particular form of magnetic resonance experiment being carried out; typical sample sphere radii are about 5 centimeters (cm.) for chemical-shift spectroscopy experiments and about 15 cm. for $^1$H head imaging and about 25 cm. for whole-body $^1$H imaging. The linearity of the static $B_0$ field is established by the main and correction windings of the superconducting magnet means 11 and, for a dual imaging/spectroscopy system at a static magnetic field value of about 1.5 T should have a maximum spatial deviation of about 2 ppm across the 5 cm. spectroscopy sample sphere. Our novel magnetic resonance imaging/spectroscopy system has typically achieved magnetic field spatial deviations of $\pm 1.7$ ppm across a imaging sphere of radius $R_i$ of 15 cm. and $\pm 0.05$ ppm across a chemical shift spectroscopy imaging sphere of radius of 5 cm. In addition to a high degree of spatial linearity, a very small value of deviation of the static magnetic field with time (i.e. high temporal stability) is also required, because typical experiments require a relatively long time, ranging from tens of seconds to tens of minutes, to complete; the higher the temporal stability, the better the spatial resolution of images and the spectial resolution in spectroscopy. If necessary, temporal instability in the main static $B_o$ field can be compensated for by the addition of at least one additional corrective winding in the superconductive magnetic means 11. The corrective winding(s) can be driven by a feedback loop with an NMR lock, and the like, as is well known to the art. The corrective winding(s) may, alternatively, be driven with a fixed-time-constant ramp signal that produces a magnetic field of equal, but opposite, sign to the temporally-instable $B_o$ field component, if the latter instability is monotonic and linear with time. Our novel magnetic resonance imaging/spectroscopy high-field system achieves a temporal stability of better than $\pm 2.5$ ppm/hr.

The X, Y, and Z magnetic field gradients $G_X$, $G_Y$ and $G_Z$ are also subject to spatial and temporal constraints by the imaging/spectroscopy procedure. Two important aspects of the gradient fields are the spatial linearity, which is a function of the gradient coil itself, given a constant coil current flow; and the temporal response of the gradient field to an electrical current impulse, which is a function of the time constant of the electronic circuitry supplying the gradient current to the associated gradient coil, and of the gradient coil and the electrical and magnetic characteristics of its environment. The gradient field spatial linearity must be provided solely by the design of the gradient coil itself; many forms of highly volume-linear gradient coils are known, such as, for example, the gradient field coils described and claimed in co-pending application Ser. No. 548,174, filed Nov. 2, 1983 (and now U.S. Pat. No. 4,646,024, issued Feb. 24, 1987), assigned to the assignee of the present application and incorporated herein in its entirety by reference. Gradient field non-linearity produces spatial distortion in NMR images and results in inaccurate mapping of the anatomy in medical applications. In practice, a 10% gradient field non-linearity across the imaging volume is probably tolerable. However, the gradient fields must be monotonic along the axis of application. Non-monotonic gradient fields, within the imaging volume, will prevent acquisition of spatial image information from regions wherein the gradient field is not uniquely single-valued. The gradient field temporal response, while having some relation to the time constants of the gradient coils themselves, is also affected by currents in the surrounding structure, which introduce time-dependent, interfering field perturbations, and only minimally affected by the time constants of the circuitry supplying the gradient-determining current to the associated gradient coil means, due to the relative ease in constructing high-power amplifiers with outputs capable of sufficiently-rapid change (e.g. in the audio-frequency range). For a system utilizing the illustrated Cartesian coordinates, with the gradient field in the direction of each axis being associated with a set of gradient coil means, a separate one of a plurality of gradient power supply means 14 is utilized to establish the gradient current through each associated axis coil means responsive to the instantaneous value of a gradient signal $G_{AS}$, where A is the particular axis direction. Thus, an X-gradient power supply means 14X supplies to the X-axis gradient coil means 12X a $G_X$-gradient-forming current of magnitude and polarity determined by the magnitude and polarity of an input gradient $G_{XS}$ signal; a Y-gradient power supply means 14Y supplies to the Y-axis gradient coil means 12Y a $G_Y$-gradient-forming current of magnitude and polarity determined by the magnitude and polarity of an input gradient $G_{YS}$ signal; and a Z-gradient power supply means 14Z supplies to the Z-axis gradient coil means 12Z a $G_Z$-gradient-forming current of magnitude and polarity determined by the magnitude and polarity of an input gradient $G_{ZS}$ signal. Each of the gradient-forming signals $G_{XS}$, $G_{YS}$ and $G_{ZS}$ is typically of pulsed nature; the amplitude transfer characteristics of each gradient power supply means 14 may be entirely linear or may be deliberately established as a predetermined non-linear transfer function, as required to provide a linear gradient magnetic field in each of the X, Y or Z directions responsive to the actual driving signal provided thereto. The transfer function of each of the gradient power supply means and its associated gradient coil can be made perfectly linear, whereby a perfectly linear gradient magnetic field is provided for a perfectly linear gradient power supply means input signal, or can be non-linear in any desired monotonic manner. Due to relatively low duty cycles, e.g. about 10%, of the pulsed audio-frequency gradient coil currents required, our system uses power supply means (such as Tecron Model 7570/7560 supplies with CM1 constant-current modules) having about 2 KW. output power capability and a bandwidth from DC to about 40 KHz. for each gradient coil axis.

The total magnetic field $B_Z$ acting on each small volume element (voxel) of the sample establishes the exact Larmor frequency of that small volume in conjunction with the gyromagnetic constant $\gamma$ for a particular nuclei species being investigated. That is, a particular species of nuclei, all of which are bound in the same chemical environment, will have identical Larmor frequencies in a uniform magnetic field, but, responsive to the changing magnetic field provided by the field gradients, will have Larmor frequencies occurring over a range, responsive both to the gradient magnitude and polarity and to the position of the volume element containing the radiating nuclei within the total field. The nuclei are initially stimulated by excitation radio-frequency (RF) energy at their Larmor frequencies as determined by the species gyromagnetic constant and the net field $B_z$ which in general varies over the sample volume due to the application of the gradient fields; this RF energy enters the sample from an RF magnetic field provided by an excitation antenna 16a. The RF energy is provided to antenna 16a via an excitation cable 18a, typically of coaxial construction, from the output 20a of an RF power amplifier means 20. Responsive to the excitation RF magnetic field, the various small nuclei voxels each reradiate an RF signal at the Larmor frequency determined by the total instantaneous field magnitude at the species sample location. This reradiated signal is received by a reception antenna 16b and is provided via a cable 18b, also typically of coaxial construction, to the input 22a of a reception RX preamplifier means 22. Excitation antenna 16a and reception antenna 16b may both surround the anatomical sample being investigated and are always placed within the magnet means bore 10a. Because the gradient coils 12 are typically of a size to provide imaging gradients for the largest of samples to be accommodated, the antennae 16 are typically placed within the free bore 12a of the gradient coils. Further, it is often desirable when providing antennae 16 wound on cylindrical coil supports concentric with the magnet axis Z, to have the excitation antenna 16a of somewhat greater diameter than the reception coil 16b, to provide a desired uniformity of excitation RF magnetic field across the sample volume to be investigated. It should be understood that a large variety of forms of excitation and/or reception antennae are known and any such form utilizable at Larmor frequencies associated with imaging and/or spectroscopy experiments can be used; considerations of spatial and temporal linearity and stability, as well as sensitivity, may affect the choice of a particular antenna, or antennae, for a particular experiment. For example, the elliptical slotted tube resonator, described and claimed in co-pending application Ser. No. 609,043, filed May 10, 1984 (now U.S. Pat. No. 4,641,097, issued Feb. 3, 1987), the novel bird-cage RF coil, described and claimed in co-pending application Ser. No. 659,043 filed Oct. 9, 1984, abandoned when continued as a file wrapper continuation application Ser. No. 884,674 (allowed), (both assigned to the assignee of the present application and incorporated by reference herein in their entirety), or the saddle-shaped or sinusoidal-shaped RF coil designs described by P. A. Bottomley (in Proc. Intnatl. Symp. or NMR Imaging, Winston-Salem, 1981, (Dept. of Radiol., Bowman Grey School of Medicine, Winston-Salem, N.C.) pp 25-31) with the additional of capacitors distributed along the lengths of the coil wires to enable tuning of the coils at the substantially higher fields used herein, are all suitable RF excitation/reception means.

RF power amplifier means 20 supplies the excitation signal responsive to a transmitter RF signal provided at the power amplifier means input 20b, via a cable 24a, from the RF output 26a1 of an RF transmitter means portion 26a, forming part of an NMR spectrometer 26. For $^1$H whole body NMR imaging, typical pulsed RF power requirements are 1 KW-10 KW for up to 4 millisecond duration, with up to 10% duty cycle; negligible leakage must be achieved during data acquisition. The RF amplifier must be operable at all of the desired NMR frequencies. At 1.5 T, these frequencies are 64 MHz., 59 MHz., 26 MHz., 16 MHz. or 16 MHz., respectively for respective $^1$H, $^{19}$F, $^{31}$P, $^{13}$C or $^{23}$Na nuclei. The signal at transmitter means portion output 26a-1 is, as further described hereinbelow, provided at an instantaneous frequency determined by the frequency of a signal provided at a second transmitter means portion input 26a-2, and with a modulation envelope of shape and timing determined by RF pulse-shape (PS) determining and gating signals provided at a second RF transmitter means portion input 26a-3.

The response signals received at preamplifier means input 22a are, after low-noise amplification in means 22, provided at an output 22b thereof and coupled, via another cable 24b, to a preamplified signal input 26b-1 of a receiver means portion 26b of NMR spectrometer means 26. Within receiver means portion 26b, the preamplified signal is compared to a local oscillator frequency, provided at a second receiver means portion input 26b-2, to provide a pair of phase-quadrature I and Q signals at a receiver means portion output 26b-3. Power amplifier means 20 provides a gating signal at a third output 20-c, via a cable 24e, to a second input 22c of the preamplifier means 22, for temporarily disabling, and protecting, the preamplifier means whenever an excitation pulse is being provided by power amplifier means 20.

A common portion 26-1 of the NMR spectrometer means 26 not only provides the RF local oscillator signal to the receiver means portion input 26b-2, via a cable 24c from a first RF output 26-1 of the spectrometer common portion 26c, but also provides the same frequency, via another cable 24d from a second RF ouput 26-2 of common portion 26c, to the transmitter means first input 26a-2. The particular frequency is selected responsive to at least one frequency-determining signal at a control input 26-3 of spectrometer common portion 26c. It will be seen that, while means 26 is denoted as an NMR "spectrometer", this means is used for all NMR experiments, of imaging as well as chemical-shift spectroscopy nature. It should be understood that, because power amplifier means 20 and low-noise preamplifier means 22 are best utilized with relatively short lengths of cables 18a and 18b, these means may not be physically located at the same location as means 26, and are semantically distinguished from the "spectrometer" only to highlight this difference in location; those skilled in the art may equally as validly refer to all of means 20, 22 and 26 as an "NMR Spectrometer" without violating the spirit or intent of the present invention.

System 10 includes a data processing and control means 28, comprised of a computer means 30, having a first input/output (I/O) port 30a for communications with a systems control means 32 (such as a keyboard device and the like), and an output port 30b for providing video information and the like signals to a display means 34, for providing a temporary display of the information acquired from the anatomical sample being investigated. Data processing and control means 28, in addition to computer means 30, comprises: an array processor means 36 so coupled to computer means 30 as to provide relatively rapid fast Fourier transform (FFT) calculations and the like upon data transferred thereto from the computer means; a disk storage means 38 for providing semi-permanent storage and retrieval of relatively large amounts of digital information (e.g. the sample information from each of a multiplicity of sample experiments); and an interface means 40 serving to interconnect the computer means 30 with the NMR spectrometer means 26 and the plurality of gradient power supply means 14.

Interface means 40 has a first output port 40a for providing, via a plurality of signal-carrying conductors 42, the various pulse-shape-determining and pulse gate signals to be transmitted to the control input 26a-3 of transmitter means portion 26a. A second interface means output port 40b provides, via a plurality of conductors 44, the relevant computer data channel signals to spectrometer input 26-3 for establishment of spectrometer frequencies and the like common information. An interface means first input port 40c receives, via a plurality of cables 45, the quadrature I and Q signals from the output 26b-3 of receiver means portion 26b. Interface means 40 also, advantageously, comprises a gradient drive switching means 48, further described in detail hereinbelow, which receives information describing the gradient magnetic fields to be established within the gradient coil bore 12a and provides the proper gradient drive signals $G_{XS}$, $G_{YS}$ and $G_{ZS}$ at the respective gradient drive signal output ports 48a, 48b and 48c to the respective X-gradient power supply means 14X, Y-gradient power supply 14Y and Z-gradient power supply means 14Z.

The Interface Means

Figure 2:
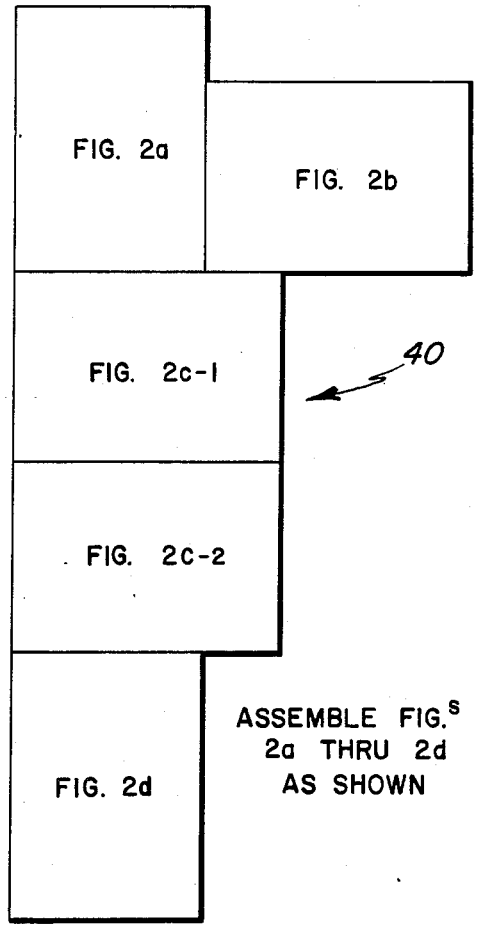
FIG. 2, comprised of the schematic block diagrams of FIGS. 2a-2d, illustrates a presently preferred embodiment of an interface means for use in the NMR system of FIG. 1.
Figure 2B:
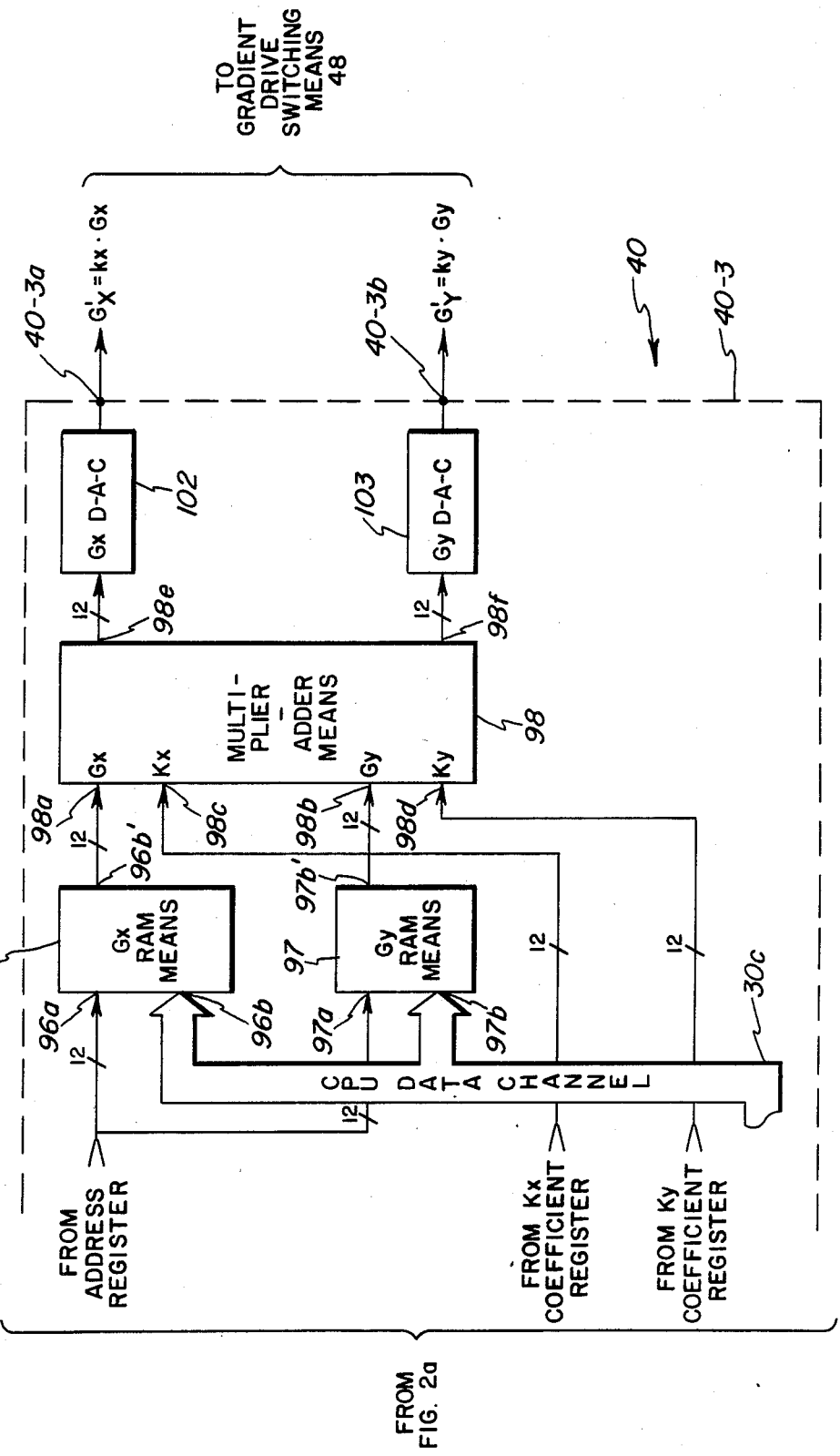
FIG. 2e is a schematic illustration of the 64-bit microcode data word format, a portion of which is transferred via the data bus in the interface means of FIG. 2, and useful in appreciating the principles of operation of the interface means.
Figures 1, 2C:
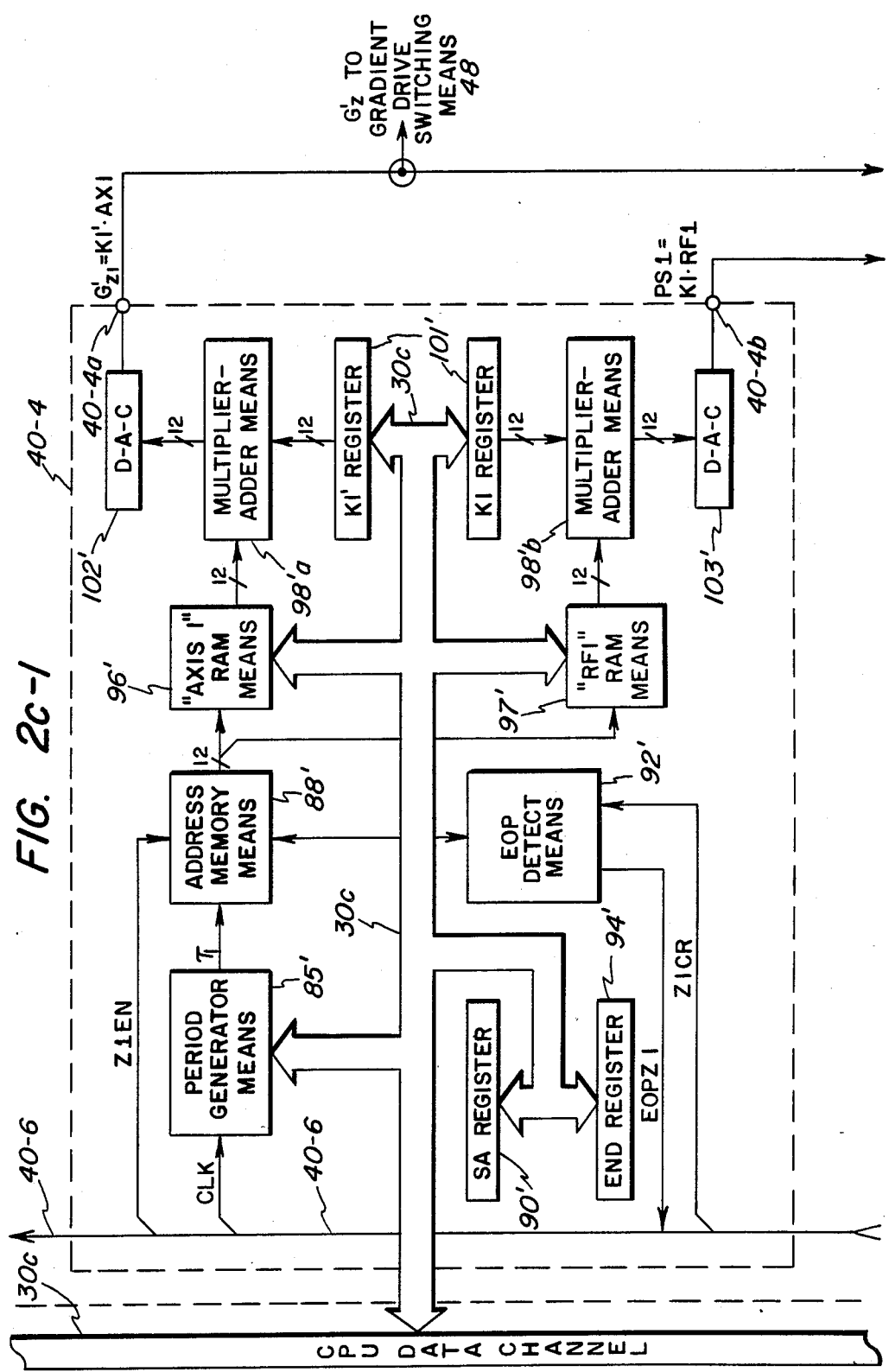
Figures 2, 2C:
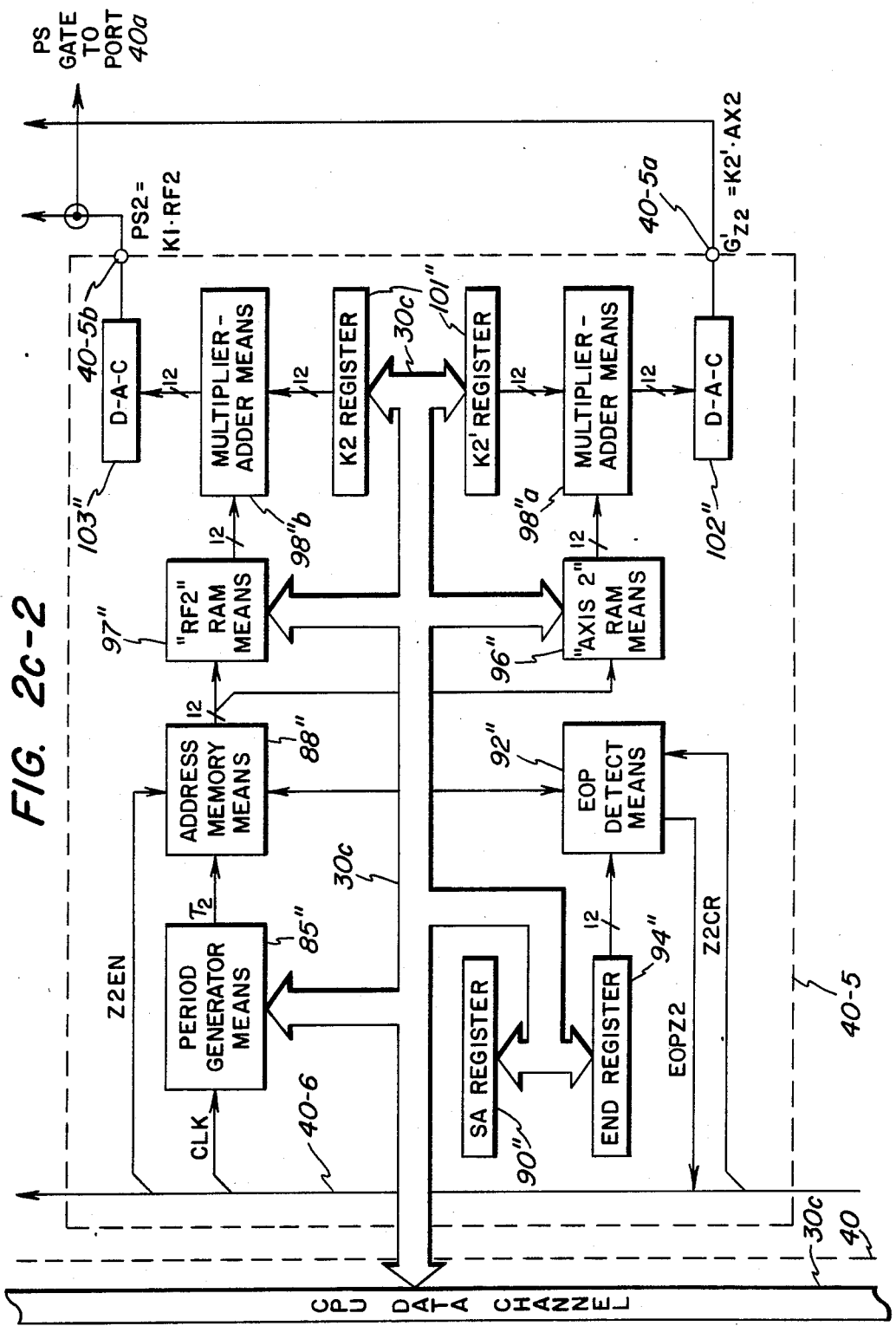
Figures 2D, 2E:
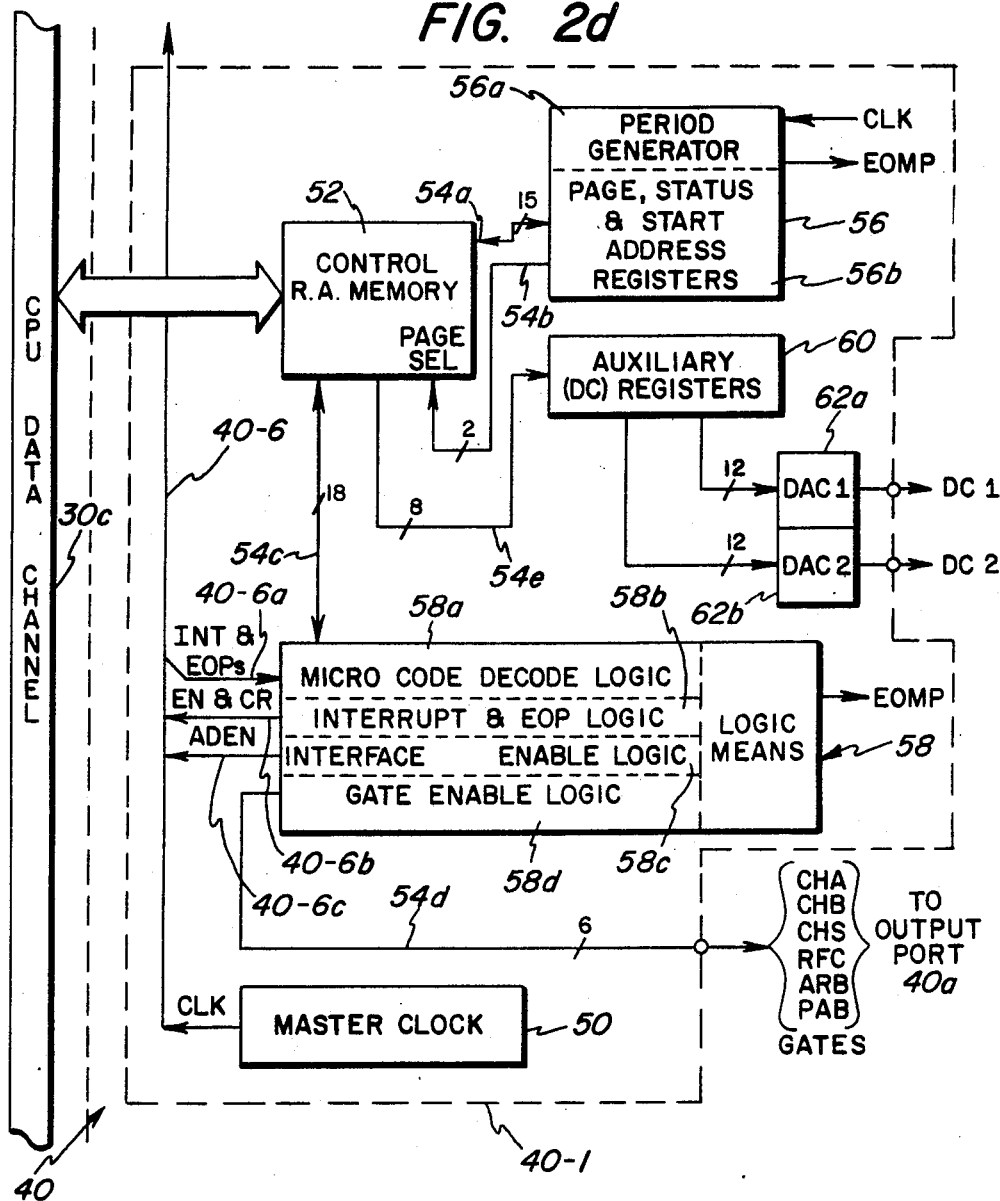

Referring now to FIGS. 2a–2d, joined together as shown by FIG. 2, and to FIG. 2e, interface means 40 receives digital information from the computer means central processor unit (CPU) data channel 30c: for providing gradient field signal waveforms $G'_X$, $G'_Y$ and one of a pair of Z-gradient-field signal waveforms $G'_{Z1}$ and $G'_{Z2}$ to means 48; for providing the pulse-shape and gate signal waveforms to output port 40a (and thence to spectrometer transmitter means portion input 26a-3); for providing frequency and other common information to output port 40b (and thence to spectrometer input 26-3); and for processing the quadrature I and Q video signals provided from spectrometer receiver means portion ouput 26b-3. The following illustrative example of interface means 40 is a presently preferred embodiment which is utilized with a general-purpose Data General type S/140 minicomputer (as computer means 30) and with a Floating Point Systems type AB120B high-speed array processor (means 36) in a 1.5 T superconducting imaging/spectroscopy system. Data channel 30c is a 16-bit-wide data bus. Bus 30c provides minicomputer-generated data to: an interface master sequencer portion means 40-1; a digitizer portion means 40-2; an interface first-type waveform-generator portion means 40-3; a pair of interface second-type waveform-generator portion means 40-4 and 40-5; and to the interface means second output port 40b. Interface means 40 also comprises an interface means internal data bus 40-6 having a plurality of conductors interconnecting the master sequencer portion means 40-1 with, and for control of, digitizer portion means 40-2 and waveform-generator portion means 40-3, 40-4 and 40-5. Bus 40-6 is implemented as a 35-bit-wide bus in the illustrated embodiment.

Master sequencer portion means 40-1 comprises a master clock means 50 for providing an internal clock (CLK) signal periodic waveform (illustratively at about 10 MHz.) to all of the interface means portions. A control random-access memory means 52 stores microcode instructions, downloaded from minicomputer means 30, for controlling the operational sequences of digitizer portion means 40-2 and waveform-generator portion means 40-3, 40-4 and 40-5. Thus, the microcode instructions contained in each one of four 256-word pages of memory means 52 will determine the order in which the waveform-generator portions are enabled, the length of various time intervals in the pulse sequence signal waveforms, the controlled flow of operational sequences which require nested or alternative subsequences, data acquisition times and the like. Coupled to CPU data channel 30c and to control memory means 52, via a data bus 54a and a page-selection bus 54b, is a period generator and page, status and start-address registers means 56. The period generator portion 56a receives data from memory means 52 and receives the master clock CLK signal from means 50. Also coupled to control memory means 52, via a multi-bit bus 54c, is a logic means 58. Logic means 58 contains four logic portions: a microcode decode logic portion 58a which receives the microcode instructions from memory means 52, decodes the microcode instructions and causes the proper sequence of operations to occur responsive thereto; an interrupt (INT) and end-of-period (EOP) logic portion 58b, which receives INT and EOP signals from a portion 40-6a of the interface internal bus; an interface enable logic portion 58c, which provides enable (EN) and continuous-run (CR) signals to the waveform-generator portions 40-3 through 40-5, via a portion 40-6b of the interface means bus, and provides a digitizer portion means 40-2 enable (ADEN) signal via another interface means bus portion 40-6c; and a gate enable logic portion 58d which provides the six gate signals (signals CHA, CHB, CHS, RFC, ARB and PAB), as hereinbelow further explained, on a six-connection bus 54d to interface means output port 40a. Control memory means 52 is also connected via a multi-bit bus 54e to an auxiliary, or data control (DC), registers means 60, which itself provides a pair of 12-bit digital words to an associated one of a pair of digital-to-analog conversion means 62a or 62b, themselves providing auxiliary analog signals DC1 or DC2 from the master sequencer portion.

The 64-bit microcode data word has a format, as shown in FIG. 2e, containing five fields. The first 16 bits (i.e. bits b0–b15) form a period generator field which initializes period generator portion 56a to select an output signal waveform of period and/or frequency to be generated during a time interval commencing with the availability of that data word (i.e. when the control memory 52 receives the address of that data word from an register portion 56b) and terminating at the end of the time interval selected by the period generator field for that particular data word. The 16-bit period generator field, coupled with an interval six-decade divider (discussed in further detail hereinbelow) allows each control memory word to be present during any interval from 0.1 microseconds to at least 409.6 seconds. The enable (EN), interrupt (INT) and synchronization (sync.) field is an 8-bit field (i.e. bits b16–b23) which is further subdivided into 8 single-bit subfields to provide the enable, continuous-run, end-of-period interrupt, accept external synchronization and next control memory word address conditions for a present control data word instruction. Separate data bit subfields are provided to, inter alia, initially enable and/or set for continuous run the XY-gradient generator portion means 40-3; enable the digitizer portion means 40-2; issue an interrupt at any EOP signal from any of the other interface means portion means 40-2 through 40-5; cause all portion means 40-1 through 40-5 to cease operation upon generation of an end-of-period (EOP) signal; cause the master sequencer means control memory address to advance to a selected one of the next address or an alternate control memory address, upon generation of an EOP signal; and similar functions. In conjunction with the period generator field, the next 8-bit field (i.e. bits b24–b31) contains the next master sequencer control memory address, which will be called unless a jump to an alternate control memory address is specified in the jump subfield. Since each next-address field is of only 8-bit width, the next address specified must be upon the same 256-word page as the previous address, unless the page register in portion 56b is updated by the CPU, during the period when a present data word is being executed. The data word format ends with a pair of 16-bit fields for respectively controlling the Z1 or Z2 gradient generators and different respective trios of the six gate signals to be made available at interface means output port 40a. Each of the last two fields also provides a 4-bit subfield, which is transmitted via bus 54e to the auxiliary (DC) registers means 60, for selecting the appropriate one of a plurality (e.g. 12) of the auxiliary registers to provide the 12-bit data input to one of DAC means 62a or 62b. The data-correction DC output(s) thus provided can be any auxiliary analog signal(s).

Master sequencer portion means 40-1 is thus responsible for performing the following functions:

(1) generating a clock CLK signal (e.g. at 10 MHz.) for synchronization of all interface portion means 40-1 through 40-5;

(2) determining the basic timing relationships between the gradient, gating and other signal waveforms generated by the various interface portion means 40-1 through 40-5;

(3) enabling and disabling other interface portion means 40-2 through 40-5 at specified times;

(4) clocking out "dead" time intervals when none of the other interface portion means 40-2 through 40-5 are enabled;

(5) generating interrupts to the computer means CPU at specified times;

(6) controlling the logic levels of six logic (TTL) gate signals which are used for various system utility functions, such as spectrometer means 26 control, RF excitation signal gating, receiver blanking and the like;

(7) determining whether the system is in a "run" mode wherein waveforms and control signals are being actively generated, or whether the system is in a "dormant" mode wherein those signals are not being generated and interface means 40 is dormant and awaiting instructions from computer means 30, via CPU data channel 30c; and (8) selecting two of a multiplicity of auxiliary DC registers 60 to be gated into the pair of 12-bit DAC means 62 for providing analog signal outputs for use in those parts of the system, such as DC magnet compensation and the like, where response speed is not a critical factor.

In normal operation, the control memory and the page/address registers are downloaded with program information via the CPU data channel 30c. Each control program must fit within one of the four 256-word pages, so that four distinct NMR experiment programs can simultaneously reside in the control memory. Upon receipt of a start signal, master sequencer means 40-1 commences operation and the page and starting address information in register portion 56b is used to select the control memory address to provide a first instruction to logic means 58. Once master sequencer means 40-1 is running, computer means 30 can obtain the status thereof from the status registers in portion 56b. Master sequencer means 40-1 enables, responsive to the signals in the various fields of the data word then provided to logic means 58, the various ones of the output signals to be generated from portion means 40-1 through 40-5 and determines the timing of the various signals generated responsive to the present data word. Master sequencer portion means 40-1 will remain at a particular control memory address, and a particular data word will be acted upon, until the interrupt and EOP logic portion 58b receives either an end-of-master-period (EOMP) overflow signal from the period generator portion 56a of master sequencer means 40-1 or an EOP signal from one of the gradient waveform-portion means 40-3 through 40-5. At the occurrence of either event signaling the end of a predetermined time interval, the control memory jumps to a new memory address. While this next address will usually be the next address specified in the data word field of bits b24–b31, the control memory will jump to an alternate address if the "enable alternate address" subfield of the EN, INT and sync. field (e.g. specifically bit b23 in our illustrated system) is enabled and an alternate address has been loaded (via data channel 30c) into an alternate address register in portion 56b, while a previous data word was controlling the master sequencer. If an alternate address has not be loaded, the master sequencer board halts; the system remains in the "run" mode (until turned off by an instruction from computer means 28 to the appropriate register of means 56) thus enabling the computer means to force the master sequencer means to exit an instruction loop without disturbing the system timing.

Since either an EOP signal generated by one of portion means 40-2 through 40-5, or the elapsing of the time period determined by the master sequencer portion means period generator portion 56a, can cause the next-subsequent address of the control memory means 52 to be enabled, the period generator time interval set by the period generator field (bits b0–b15) can be utilized in two different manners. If one of the other portion means in interface means 40 is normally expected to generate an EOP signal for the conditions established by a particular data word then enabled, then the additional EOMP signal provided by period generator portion 56a is redundant, but serves as a "watchdog" timer in the event that the other portion means fails to provide the expected EOP signal for any reason. Conversely, if no other portion means 40-2 through 40-5 is expected to generate an EOP signal for the conditions enabled by the present data word (a condition which obtains when, for example, no other portion means 40-2 through 40-5 is enabled by the data word then enabled in master sequencer portion means 40-1), then the EOMP signal determines how long the master sequencer portion means 40-1 stays at the present data word address and clocks out "dead" timing intervals when no gradient signal waveform is being generated. In addition, establishment of timing intervals by proper setting of the period generator field can be utilized to synchronize the activities of a plurality of the waveform-generator portion means 40-3 through 40-5. For example, if one, or both, of the X-gradient field and/or Y-gradient field signal waveforms must commence after exactly one-half of the Z-gradient field signal waveform generated by one of the Z1 or Z2 waveform-generator means 40-4 or 40-5, the master sequencer portion means 40-1 may be programmed to commence the Z-gradient field signal waveform generation at a first address (A), responsive to a data word having a period generator field establishing the period generator portion 56a in a manner such that the EOMP signal is generated at the end of a time interval equal to one-half of the time interval required to generate the entire Z-gradient signal waveform. When this time interval elapses and the EOMP signal is generated, the master sequencer portion means increments the control memory means 52 to its next address. At this next-subsequent address (B), the 64-bit data word contained in control memory 52 contains EN, INT and sync. field subfield bits which enable both the XY waveform-generator portion means 40-3 and the Z1 waveform-generator portion means 40-4. Thus, the XY waveform-generator portion means will begin to generate the required X-gradient field and/or Y-gradient field signal waveforms, while the Z1 waveform-generator portion means will continue operating as if the transition to this next-subsequent data word had not occurred. If the period generator field for this next-subsequent data word (at address B) is set for the same time interval (i.e. one-half the total time interval required) as in the previous data word (at address A), then the X and/or Y and Z gradient fields all terminate at the same time and the X and/or Y gradient fields are present for only one-half the total time interval during which the Z gradient field is present, as initially required. Since all portion means 40-1 through 40-5 are clocked by the common master clock means 50, the synchronization of a plurality of portion means 40-1 through 40-5 is relatively accurate, having a maximum error of only several logic-gate delays (a maximum error time considerably less than the 100-nanosecond clock cycle time for a 10 MHz. CLK signal).

It should be understood that master sequencer portion means 40-1 may provide many other functions beyond the minimum above-described functions required by our high-field system. For example, master sequencer portion means 40-1 can provide an interrupt signal to computer means 30 upon termination of the presence of any, or all, data word in logic means 58 (i.e. upon the loading of a next-subsequent data word in logic means 58 from control memory 52). Thus, a preselected subfield (such as the bit 19 subfield) of the EN, INT and jump field of any particular data word can be set to generate a CPU interrupt responsive to an EOP, EOMP or other condition for any data word at the termination of which the CPU must perform some operation (such as reloading a portion means register and the like), or when an abnormal condition occurs. Similarly, the status registers of portion 56b can be established to be read by the computer means CPU such that the computer means can ascertain which control memory data word address generated the interrupt and/or which of portion means 40-1 through 40-5 generated an EOP signal. Similarly, the start address register of portion 56b can be utilized as a start address/run register, determining not only the starting address within a page, but also determining the start and stop conditions of the master sequencer portion means. Further, the page register of portion 56b can be utilized as a page/clock register which is loaded, via data channel 30c, from the computer means CPU to select which of a plurality of CLK signal sources (the internal master clock means 50 or a selected one of at least one external clock signal sources) is to be utilized by the interface means, as well as which of the plurality, e.g. four, pages of control memory will be then utilized. It should also be understood that the master sequencer portion means 40-1 is illustrated, in FIG. 2d, in logical block diagram form, and that actual physical portions of means 40-1 (or of any of the other portion means of the interface means) can be physically present on a single printed circuit board or on several printed circuit boards, with or without portions of other portion means 40-2 through 40-5.

In particular, because of the relative few integrated circuits required for the Z-gradient waveform generator portion means 40-4 and 40-5, and the relatively large number of integrated circuits required to implement master sequencer portion means 40-1, the bit b32–b63 portion of control memory means 52 and at least portions of the gate enable logic, DC register and DAC means have been physically integrated therewith in the actual physical system implementation of our presently preferred system embodiment.

Referring now to FIG. 2a, digitizer portion means 40-2 receives a pair of phase-quadrature I and Q video signals (from receiver means 26b) at interface means input port 40c. The I signal appears at a first digitizer portion means input 40-2a, connected to the input 66a of a first sample-and-hold (S & H1) means 66, while the Q signal appears at a second digitizer portion means input 40-2b, connected to the input 68a of a second sample-and-hold (S & H2) means 68. Each of sample-and-hold means 66 and 68 will, responsive to a predetermined logic state at the associated sample input 66b or 68b, sample the present value of the analog I or Q signal and hold that value at an associated output 66c or 68c, respectively. The held sample I output 66c signal is coupled to the analog input 70a of a first analog-to-digital converter (ADC1) means 70, while the held sample Q output 68c signal is coupled to the analog input 72a of a second analog-to-digital converter (ADC2) means 72. Responsive to the proper state of a signal at the associated one of the conversion control inputs 70b or 72b, ADC1 means 70 or ADC2 means 72 provides a multiple-bit digital data word (corresponding to the magnitude of the respective input analog signal) at an associated output 70c or 72c, respectively. Each of means 70 and 72 is a high-speed 15-bit ADC which, after digitization, provides a data word which is sign-extended to a normal 16-bit two's-complement format. The I and Q channel video information is converted to interleaved digital data words, with the I channel word always "appearing" first at a First-In-First-Out (FIFO) register means 76. The interleaved sample/conversion process of the two information channels is carries out responsive to the two logic states of the signal on wire 74. FIFO register means 76 will typically store a plurality P, e.g. P=2 in the illustrated embodiment, of sequential data words; thus, the digital data word does not appear at the register means output 76c, and is not coupled to the CPU data channel 30c, until P 16-bit data words are present in the register (i.e. after one pair of interleaved I and Q channel conversions have occurred).

Control submeans 80 includes not only a programmable clock period generator portion 80a, controlling the time interval between each analog-to-digital conversion, but also includes a starting address register portion 80b and a word count register portion 80c for determining, in conjunction with a word count zero detector means 82, the total number of interleaved conversions required and the completion of that required number of conversions. Since a pair of interleaved conversions occur for each cycle of the logic level waveform on line 74, itself provided as the output of programmable clock period generator portion 80a, the word count (WC) register portion 80c is directly loaded from CPU data channel 30c with the required number of words prior to the enablement of digitizer portion means 40-2. The time interval between line 74 logic state changes is also loaded into programmable clock period generator portion 80a prior to portion means 40-2 enablement. The particular ADC means 70 and 72 utilized in our presently preferred system allow a maximum speed of about $2.5 \times 10^5$ pairs of interleaved data conversions for second or about 4 microseconds per data point, where each data point contains both an I-channel and a Q-channel data word.

In operation, the number of words of interleaved conversions is loaded into the WC register portion 80c and the clock period (a multiple of the minimum conversion time of 4 microseconds) is loaded into programmable clock period generator portion 80a. Thereafter, master sequencer portion means 40-1 generates a digitizer portion means 40-2 enable ADEN signal, which is carried by interface means but portion 40-6c to generator means portion 80a. Responsive thereto, the clock period generator portion 80a begins to generate logic level changes on line 74. Responsive to the first positive-going logic level change on line 74, storage pulses are generated for that level change and for each level change thereafter, for introduction to storage control input 76b. The initial value $WC_i$ in register 80c is decremented by one for each complete cycle of the clock period generator portion 80a. When the required number of interleaved pairs of conversions have been completed, the value in WC register portion 80c falls to zero and this zero word count register value is detected by zero word count zero detector means 82, which issues a digitizer portion means interrupt (INTD) to interface means data bus portion 40-6a. The INTD signal is transmitted to the interrupt and EOP logic portion 58b of master sequencer logic means 58 to indicate that digitization of the received NMR signal is complete. It should be understood that the use of FIFO register means 76 allows digitizer portion means 40-2 to be relatively permissive of contentions on data channel 30c with other apparatus of the direct-memory-access type, and conversion data will not be lost as long as the digitizer portion means 40-2 output can be given access to the CPU data channel 30c before register means 76 overflows. As each data word is accepted by the computer means CPU, an acceptance signal can be returned along data channel 30c to an error register means 84. An output present OP signal can be provided at register means output 76c, to error register 84, such that the ignoring of the initial invalid words can be indicated to the CPU. Conversely, acceptance by the CPU of each FIFO register means output word can be signaled. In the event that a valid FIFO register means output word is not accepted by the CPU, an overflow condition is declared by error register means 84 and is signaled back to computer means 30 via CPU data channel 30c. In addition, a second error signal, or bit, is defined by the presence of an overrange OR signal from either of the channel ADC means 70 or 72; the overrange error signal can be utilized to instruct the computer means to forego processing of any overrange (and therefore meaningless) data. In our presently preferred embodiment, only a word count zero will cause an interrupt (the INTD signal) to be generated, and analog-to-digital data conversion will continue in spite of either, or both, of the buffer overrun or conversion overrange errors, unless the system control program decides otherwise.

Referring now to FIGS. 2a and 2b, a schematic block diagram of the XY waveform-generator portion means 40-3 is shown. This portion means includes a period generator means 85 similar to the period generators in each of portion means 40-1, 40-2, 40-4 and 40-5. The clock period generator means 85 includes a frequency f selector means 85a which receives the clock CLK waveform from interface means internal bus 40-6 and receives configuring information from the computer means CPU data channel 30c. Frequency selector means 85a generates a periodic divided frequency clock CLK' signal to a first input of a period generator circuit 85b. A second input of period generator circuit 85b receives a 12-bit digital data word establishing the time interval $\tau$ between successive period pulses provided at the pulse generator means output 85d. The 12-bit pulse time interval data word is provided at the output of a period "n·f" register 85c, receiving a 12-bit period-establishing data word from computer means CPU data channel 30c and also receiving a "load" pulse from interface means internal data bus 40-6. The 12-bit data word in period register 85c allows one of 4096 possible values to be chosen for each setting of frequency selector 85a. The frequency selector 85a is provided with three selection data bits, providing eight possible configurations for the CLK' output; the frequency selector is a six-decade frequency divider having a seventh "undivided" selectable output and an eighth "off" selectable output. Thus, the programmable range of period time interval spacings in as shown in the following table:

| PROGRAMMABLE PERIOD GENERATOR OUTPUT PULSE TIMING RANGES | | | |
|---|---|---|---|
| fDATA | DECADE | CLK' FREQ. f | n · f RANGE |
| 000 | 0 | OFF | — |
| 001 | 1 | 10 Hz. | 0.1–409.6 Sec. |
| 010 | 2 | 100 Hz. | 0.01–40.96 Sec. |
| 011 | 3 | 1 KHz | 1.0 mSec.–4.096 Sec. |
| 100 | 4 | 10 KHz. | 100 μSec.–409.6 mSec. |
| 101 | 5 | 100 KHz. | 10 μSec.–40.96 mSec. |
| 110 | 6 | 1 MHz. | 1 μSec.–4.096 mSec. |
| 111 | 7 | 10 MHz. | 0.1 μSec.–409.6 μSec. |

It will be understood that period generator means 85 can be realized with other forms of circuitry, and that whichever form of period generator means 85 is utilized can be equally as well utilized for the basic period generator portion 56a of means 56 (in the master sequencer portion means 40-1), as the basis for programmable clock period generator portion 80a of means 80 in the digitizer portion means 40-2, and in any other period generator utilization required in our system.

The periodic pulses at period generator means output 85d appear at a clock CLK' input 88a of an address memory means 88. Address memory means 88 includes a first, "start" address SA input 88b receiving a starting-address data word from a start address register 90, itself receiving the starting address data from computer means CPU data channel 30c; a second, enable EN input 88c of the address memory means receives the XYEN enable signal on portion 40-6b of the internal data bus. Address memory means 88 also has a third, "end" input 88d receiving an end-count signal from a first output 92a of an end-of-period detector means 92. A first input 92b of the end-of-period detector means receives a 12-bit present-address PRA data word from a first output 88e of address memory means 88. The 12-bit data word corresponding to the present address appears at the data output 88f of address memory means 88. End-of-period detector means 92 also receives an end-address data word at another input 92c, from an end address register means 94, itself receiving the 12-bit end address data from computer means CPU data channel 30c. A third input 92d of the end-of-period detector means receives a continuous-run XYCR signal, via the internal data bus line 40-6b, from logic means interface enable logic portion 58c and provides a second output 92e on which an XY waveform-generator portion means end-of-period EOPXY signal is provided to the internal data bus interrupt portion 40-6a for return to the master sequencer logic means interrupt & EOP logic portion 58b.

The 12-bit address word at memory means output 88f is provided to the address inputs 96a and 97a, respectively, of an X-gradient $G_x$ random access memory (RAM) means 96 and a Y-gradient $G_y$ RAM memory means 97, respectively. Data can be loaded into RAM memory means 96 and 97 via the CPU data channel 30c connection to the RAM means data and control inputs ports 96b and 97b, respectively. Output data appears at a portion 96b' or 97b' of the respective RAM means data ports 96b or 97b, respectively. The 12-bit output data words appearing at these ports are respectively provided to the Gx input 98a or the Gy input 98b of a multiplier-adder means 98. Means 98 also has a pair of inputs 98c and 98d for respectively providing multiplier coefficient Kx and Ky data, respectively, from a Kx coefficient register means 100 or a Ky coefficient register means 101. The coefficient data is provided directly to the appropriate one of register means 100 or 101 from computer means CPU data channel 30c. Means 98 first (or "X") output 98e provides a 12-bit data word, corresponding to the product of the X-gradient $G_x$ term and the X-gradient coefficient $K_x$ term, to the input of an X-gradient $G_x$ digital-to-analog converter DAC means 102, while a second (or "Y") output 98f provides a 12-bit data word, which is the product of the Y-gradient $G_y$ data and the Y-gradient coefficient $K_y$ data, to the input of a Y-gradient $G_y$ DAC means 103. The respective X-gradient $G'_X$ signal and Y-gradient $G'_Y$ signal are provided at the first waveform-generator portion means outputs 40-3a and 40-3b, respectively, as audio-frequency analog signals having a maximum ±10-volt amplitude; these signals are coupled to gradient drive switching means 48.

In operation, the XY waveform-generator portion means 40-3 has two basic operating modes: the "load" mode and the "run" mode. In the "load" mode, gradient waveforms are not being generated and all of the computer means-accessible registers and memories (e.g. registers and/or memories 85a, 85c, 90, 94, 96, 97, 100 and/or 101) can have data read therefrom or written thereto by the computer means central processing unit, via data channel 30c. The "load" mode corresponds to the "XY enable" signal XYEN being in a logic 0 condition. When XYEN is in a logic 1 condition, the XY waveform-generator portion means 40-3 is in the "run" mode. Assuming that the appropriate frequency f, period n·f, start address SA and end address EA information has been previously loaded into respective frequency selector register means 85a, period register means 85c, start address SA register means 90 and end address register means 94a, that the necessary $G_x$ and $G_y$ data has been loaded into memory means 96 and 97, respectively, and the required $K_x$ and $K_y$ coefficient information has been entered into registers 100 and 101, then the appearance of a logic 1 XYEN signal causes the following operations to occur: the start address SA data is loaded into address memory means 88; the end address data is loaded into end-of-period detector means 92; and period generator means 85 begins to produce CLK' pulses each occurring τ seconds apart.

Each of the start and end addresses represents one of the 2048 possible addresses in address memory means 88. Responsive to the XYEN signal, the first, starting address SA is provided at memory means output 88f, to the RAM means 96 and 97. The data previously stored therein at the first address is made available to the $G_x$ and $G_y$ inputs 98a and 98b, respectively, of means 98, and is individually multiplied by the appropriate $K_x$ or $K_y$ coefficient from the associated one of registers 100 or 101. The resulting gradient data is transformed into an analog level by the associated one of DAC means 102 or 103 and appears at the associated one of outputs 40-3a or 40-3b. Responsive to the first pulse from period generator means output 85d, the address of memory means 88 is advanced to the next address stored therein. This new present address PRA data word is checked by the end-of-period detector means 92 against the end address data word stored in register means 94. If the present address of address memory means 88 does not match the end address of register 94, the end-of-period detector means 92 does not send an "end" signal to memory means input 88d. The new address data is provided to memory means 96 and 97 and the associated waveform data at the second requested address in each RAM means is sent to the multiplier means 98, with the new scaled waveform data being converted into the associated analog levels for appearance at the portion means outputs. The address memory means continues to provide new addresses, sweeping out the range from the start address, contained in register 90, to the end address, contained in register 94, to determine the X and Y gradient output signal waveforms. If the stop address is numerically less than the start address, the address memory means will increment from the start address until the highest address in memory means 88 is reached and will then "wrap around" to address zero and continue to increment the address memory means address data until the "end address" is reached. This "wrapping around" facility does not affect any end-of-period condition for the XY portion means 40-3. The actual end-of-period EOPXY signal will be sent from means 92 only when the present-address PRA data received from address memory means output 88e is equal to the end address data received at input 92c from register means 94. The time that is required to traverse the range of addresses from the start address to the end address is the product of the address range to be stepped through and the time interval τ between successive-address-enabling pulses from period generator means output 85d. Unless the continuous run XYCR signal is at a high logic level, each time the address memory means has advanced to the end address the end-of-period detector means 92 sends the EOPXY signal to the master sequencer portion means 40-1, and address memory means 88 is reloaded, by the appearance of an "end" signal at input 88d (from end-of-period detector means output 92a) to the start address presently contained in register means 90. Thereafter, the master sequencer portion means control memory 52 determines subsequent activity of the XY waveform-generator portion means 40-3. That is, the master sequencer control memory reacts to the EOPXY signal (or, alternatively, to any other EOP signal) by incrementing to its next control memory address. At this next control memory address, the contents of the 64-bit control memory data word will determine, for example, whether the XY waveform-generator portion means is again to receive an XYEN enabling signal to cause this portion means to once more begin to sweep out the memory addresses (and therefore the gradient signal waveforms) presently contained therein. If the XY waveform-generator portion means is not enabled, all activity in portion means 40-3 ceases until the master sequencer portion means once again sends the enabling XYEN signal.

If, however, the present master sequencer control word is such that a XY waveform-generator portion means continuous-run XYCR signal is present at detector means input 92d, then the end-of-period detector means 92 is inhibited from sending the EOPXY end-of-period signal when the ending address is present in address memory means 88. However, the auto-reload of the start address SA data from register means 90 into address memory means input 88b will still occur and therefore the XY waveform-generator portion means will continuously sweep out the address range from the previously-loaded "start address" to the previously-loaded "end address", until the XYEN enabling signal falls to a low logic level for any reason.

While the address memory means output 88f data word sweeps from the starting address to the ending address, as controlled by enabling continuous-run signal, the associated addresses in the $G_x$ and $G_y$ RAM means 96 and 97 are cyclically swept out. This provides a changing sequence of 12-bit data words to the $G_x$ and $G_y$ inputs of multiplier means 98. Each of the $G_x$ and $G_y$ actual data words are multiplied by the appropriate $K_x$ or $K_y$, respectively, coefficients from register means 100 or 101 to provide the digital data inputs for the X and Y gradient DAC means 102 and 103 and provide, responsive thereto, the analog audio-frequency gradient signals at outputs 40-3a and 40-3b.

Referring now to FIGS. 2c-1 and 2c-2, a pair of second-type waveform-generator portion means 40-4 and 40-5 are seen to contain essentially all of the same means as contained in the first-type waveform-generator portion means 40-3. As with portion means 40-3, portion means 40-4 and 40-5 each generate a pair of audio-frequency analog signal waveforms. Two different Z-gradient waveforms are often required for a single NMR imaging or spectroscopy sequence, as are two different RF pulse-shape modulation functions. As will be seen in subsequent discussion, hereinbelow, of some of the presently preferred imaging/spectroscopy sequences, the X-gradient and Y-gradient signals generally require only a single signal, of the same waveshape, amplitude and time duration, in each repetition of a particular imaging sequence, whereby any X-gradient or Y-gradient signal waveform changes can be commanded from the computer means CPU data channel 30c, in a relatively short time after the EOP of a first sequence and immediately prior to the start of a second sequence. Conversely, the Z-gradient waveform typically requires two different amplitude/time duration waveforms (even if of the same waveshape during any one particular sequence (while the RF pulse-shaping modulation (PS) gate function is often required to generate a pair of waveforms having entirely different durations, waveforms and/or amplitudes, as, for example, in any single sequence requiring a selective 90° RF pulse, typically provided with a frequency-limiting modulation envelope (such as a Gaussian, sinc or other non-rectangular waveform) and also requiring a nonselective 180° RF pulse, having a rectangular PS modulation envelope and an entirely different amplitude and duration than the selective 90° non-rectangular RF pulse. For these reasons, two Z-gradient signal waveforms $G'_{Z1}$ and $G'_{Z2}$ are to be generated, in addition to first and second RF carrier pulse-shaping PS1 and PS2 modulation envelopes. It is somewhat arbitary as to which of the two second-type waveform-generator portion means 40-4 and 40-5 generate which pair of the four signals; however, since only one pulse-shaping PS waveform signal is generally required at the same time as a Z-gradient signal waveform, it is advantageous to have one of the portion means, e.g. portion means 40-4, generate a first Z-gradient waveform and a first pulse-shaping signal waveform, while the other portion means, e.g. portion means 40-5, also generates a single Z-gradient signal waveform and a single pulse-shaping PS signal waveform. Since the Z-gradient and pulse-shaping waveforms are often enabled and disabled in sets, the above partitioning allows one of portion means 40-4 or 40-5 to be enabled at any one time, while the other portion means 40-5 or 40-4 is simultaneously disabled and being downloaded with new data from data channel 30c, for subsequent enablement at a future time (when the other one of the portion means is disabled and being newly downloaded with data for a next subsequent usage). In this manner, the varying Z-gradient and/or pulse-shaping functions can be rapidly modified during any particular NMR investigation sequence.

Each of portion means 40-4 and 40-5 has the period generator, address memory, start address register, EOP detect, end register, RAM, constant registers, multiplier-adder and analog-to-digital conversion means shown, and numbered with reference designations similar to those of portion means 40-3 (where means 40-4 has a single-prime reference designations in FIG. 2c-1 and portion means 40-5 has double-prime reference designations in FIG. 2c-2). The sequence of operation, responsive to the CLK signal to generate individually programmable memory-updating time interval signals $\tau_1$ or $\tau_2$, and with enablement responsive respectively to one of a first Z enable (Z1EN) signal or a second Z enable (Z3EN) signal, with continuous-run capability responsive to the appropriate one of a first Z continuous-run (Z1CR) signal or a second Z continuous-run (Z1CR) signal, and generation of a first or second end-of-period signal EOPZ1 or EOPZ2, respectively, will be understood by referring to the discussion of operation of portion means 40-3 hereinabove. The respective first and second gradient "axis" signals $G'_{Z1}$ or $G'_{Z2}$, or the first and second pulse-shaping signals PS1 or PS2 can be switched responsive to computer means CPU signals and/or switching signals provided on the interface means internal data bus 40-6 from master sequencer portion 40-1. Only one axis-gradient $G'_Z$ signal and only one pulse-shaping PS gate signal is provided by the pair of portion means 40-4 and 40-5 at any particular instant.

The Gradient Drive Switching Means

Figure 3:
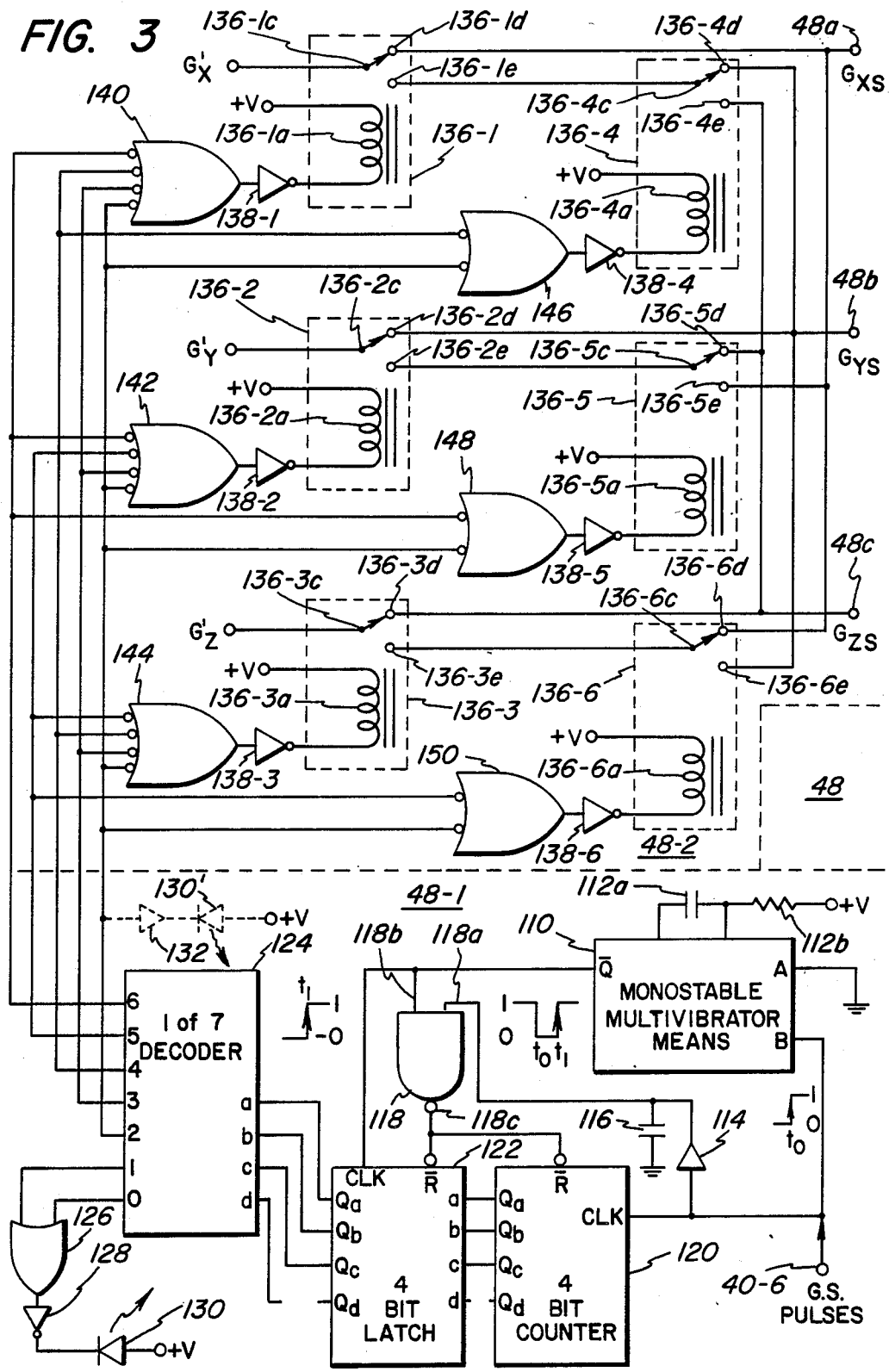
FIG. 3 is a schematic block diagram of a presently preferred embodiment of the novel gradient drive switching means portion of the interface means of our system.

Referring now to FIGS. 3, 3a and 3a', in accordance with another aspect of the present invention, interface means 40 includes gradient drive switching means 48. The gradient drive switching means receives the three axis gradient-field signals $G'_X$, $G'_Y$ and $G'_Z$ from interface means portion means 40-3 and from one of portion means 40-4 or 40-5. The gradient drive switching means then routes each of these three signals, responsive to prior-received gradient switching commands, to become the commanded one of: output signal $G_{XS}$ supplied to the input of the X-gradient power supply means 14x; output signal $G_{YS}$ supplied to the input of the Y-gradient power supply means 14y; and output signal $G_{ZS}$ supplied to the input of the Z-gradient power supply means 14z.

Gradient drive switching means 48 comprises a control portion 48-1 and a switching portion 48-2. Control portion 48-1 receives a gradient switching GS pulses from interface means data bus 40-6, which pulses are provided responsive to at least a portion of the 64-bit control data word stored in master sequencer portion means 40-1. Control portion 48-1 provides control signals to switching portion 48-2, to control switching of the appropriate one of input signals $G'_X$, $G'_Y$ and $G'_Z$ to the appropriate one of outputs 48a–48c. Control portion 48-1 includes a monostable multivibrator means 110 (such as a standard TTL 74S122 and the like) having a negative-going trigger A input connected to ground potential and a positive-going trigger B input receiving the gradient selection GS pulses; responsive to each positive-going logic transition, occuring at any time $t_0$, at the B input of means 110, the normally-high logic level $\overline{Q}$ output provides a low logic level pulse of duration ($t_1-t_0$), e.g. about 100 milliseconds, as established by the associated timing capacitive element 112a and timing resistance element 112b. The input gradient switching pulses are also applied to the input of a non-inverting buffer means 114, having its output connected to one terminal of a delay capacitance element 116 and to a first input 118a of a two-input NAND gate 118. The remaining input 118b of the gate is connected to the $\overline{Q}$ output of multivibrator means 110.

The gate output 118c is connected to the reset R input of a 4-bit counter means 120, having its clock CLK input connected to the input of buffer means 114 and thus receiving the gradient selection GS pulses, and also to the reset $\overline{R}$ input of a 4-bit latch means 112, having its clock CLK input connected to the $\overline{Q}$ output of multivibrator means 110. The first three stage outputs $Q_a$, $Q_b$ and $Q_c$ of counter means 120 are connected to the first three bit-stage inputs a, b and c, respectively, of latch means 122. The first three latch stage outputs $Q_a$, $Q_b$ and $Q_c$ of latch means 122 are connected to the first three stage inputs a, b and c of a one-of-seven decoder means 124. The "logic 0=true" outputs of decoder means 124 are configured such that the 0 and 1 outputs are respectively connected to different inputs of a two-input OR gate 126, having its output connected through an inverting buffer 128 to the cathode of a light-emitting diode (LED) 130. The anode of diode 130 is connected to a positive potential source such that LED 130 is lit whenever one of the 0 or 1 outputs of decoder means 124 is true; the 2-6 outputs of the decoder means form the outputs of control portion 48-1 to the switching portion 48-2. Each of these five lines may have the status thereof indicated by connection of the individual line through a buffer amplifier 132 and an associated LED 130' (both shown in broken line), if total interface gradient drive switching means status is to be visually observable.

Switching portion 48-2 comprises a plurality, e.g. six, of switching means 136, e.g. switching means 136-1 through 136-6 each illustratively being of the single-pole, double-throw electromechanical relay variety. The first three switching means 136-1 through 136-3 determine if the particular input signal $G'_N$ (where $N=X,Y$ or Z) is to be switched to the $G_{NS}$ output or is to be switched to a different gradient drive switching means output; the second plurality of switching means 136-4 through 136-6 determine to which of the other outputs the particular input signal is to be connected if the first switching means determines that the $G_{NS}$ output is not to be connected to the $G'_N$ input. Thus, the common terminal 136-1c, 136-2c or 136-3c, respectively, of the first three switching means 136-1 through 136-3, are respectively connected to receive the respective $G'_X$, $G'_Y$ or $G'_Z$ signal respectively. Each of the respective normally-closed, first selectable output terminal 136-1d, 136-2d or 136-3d is respectively connected to the associated one of the $G_{XS}$ output terminal 48a, the $G_{YS}$ output terminal 48b or the $G_{ZS}$ output terminal 48c. The normally-open, second selectable terminal 136-1e, 136-2e or 136-3e are each directly connected to the common terminal 136-4c, 136-5c or 136-6c of the associated one of the second plurality of switching means 136. Each of this second plurality of switching means is configured to select one of the other two output terminals. Thus, that one of the second plurality of switching means 136-4 through 136-6 associated with a particular input can select the next two outputs of the XYZ triad. That is, switching means 136-4, associated with the X channel, can be switched between a normally-closed first selectable terminal 136-4d connected to the Y-gradient $G_{YS}$ output 48b, or to the normally-open second selectable terminal 136-4e connected to the Z-gradient $G_{ZS}$ output 48c; the second switching means 136-5 can be switched between the normally-closed first selectable terminal 136-5d connected to the Z-gradient $G_{ZS}$ output 48c, or to the normally-open second selectable terminal 136-5e connected to the X-gradient $G_{XS}$ output 48a; and switching means 136-6 can be configured to connect between the normally-closed first selectable terminal 136-6d connected to the X-gradient $G_{XS}$ output 148a, or the normally-open second selectable terminal 136-6e connected to the Y-gradient $G_{YS}$ output 48b. For the illustrated electromechanical relay form of switching means 130, each switching means actuating coil 136-1a through 136-6a is connected between a source of operating potential +V, and the output of an associated inverting buffer means 138-1 through 138-6. Each of the first plurality of inverter buffer means 138-1 through 138-3 is driven by the output of an associated one of a four-input NOR gate 140, 142 or 144. The inputs of gate 140 are respectively individually connected to the associated one of the 2, 3, 4 or 6 output of control portion decoder means 124, while the inputs of gate 142 are respectively individually connected to the associated one of the 2, 3, 5 or 6 output of decoder means 124, and the inputs of gate 144 are respectively individually connected to the associated one of the 2, 3, 4 or 5 output of decoder means 124. A second plurality of two-input NOR gates 146, 148 and 150 have their outputs connected to the input of the associated one of inverting buffer means 138-4 through 138-6, with each two-input gate having one of its inputs connected to the two-output of decoder means 124 and having the other input respectively individually connected to the associated one of the 4, 6 or 5 output of the decoder means.

In operation, gradient drive switching means 48 operates responsive to gradient-switching GS pulses of two types: a "long" gradient pulse, having a time duration greater than the duration of the pulse at the $\overline{Q}$ output of multivibrator means 110; or a "short" gradient pulse, having a time duration less than the duration of the pulse at the multivibrator means output. Each pulse starts at a resting low logic level and is present for the desired time at a high logic level. Responsive to the delay introduced to the incoming pulse by buffer 114 and delay capacitance 116, a long pulse will be present at gate input 118a after the multivibrator 110 output pulse has returned to the logic 1 level, and not only generate a low logic level resetting pulse to counter means 120 and counter means 122, but will also thereafter generate a positive-going clocking pulse at the latch means clock CLK input. The short pulse is present for an insufficiently-long time to generate a resetting signal at the gate 118c output, although a short pulse will generate a clock edge advancing the count in counter means 120 and will thereafter provide, via the positive-going edge of the multivibrator means output pulse, a CLK signal latching the new count to the output of latch means 122. At the end of any NMR experiment sequence, gradient drive switching means 48 can receive a sequence consisting of none or one long pulse and none to six short pulses. The absence of an initial long pulse acts to preclude resetting of control portion 48-1; if no short pulses follow, the output gradient signals are not affected and remain as previously commanded. The use of at least one short pulse without an initial long pulse is "locked-out" in the programming of the computer means and/or the interface means master sequencer portion means. It should be understood, however, that additional logic elements may be added to control portion 48-1, between the counter CLK input and the inputs to buffer 114 and multivibrator 110, or otherwise as easily determined by one skilled in the digital arts and in accordance with the desired "lock-out" characteristics, to prevent a short pulse from having an effect upon gradient drive switching means control portion 148-1 unless preceded by a long pulse. In the illustrated presently preferred embodiment, any gradient switching GS pulse sequence beginning with at least one long pulse can be followed by 1–6 short pulses. The use of a long pulse followed by zero short pulses or a long pulse followed by more than six short pulses, is specifically "locked-out" in the system programming, although, as before, it should be understood that additional digital circuitry may be utilized in control portion 48-1, to provide a hardware alternative for this software "lock-out". Thus, the valid gradient switching sequences initialized with a single long pulse have 1–6 short pulses. With a single short pulse in the setting sequence, decoder output 1 is set to a low logic level; as output 1 is not connected to any of gates 140–150, switching means 136 all remain in their normally-closed conditions. Therefore, each of the first plurality of switching means 136-1 through 136-3 respectively connect the X input to the X output, the Y input to the Y output and the Z input to the Z output; this commands a normal axial view, in which a slice of constant thickness of the Z direction through a sample is provided (as shown by the axial slice profile, through the diagrammatic head of a patient being medically investigated by the system, as shown in FIG. 3a'). With a pair of short pulses following a long resetting pulse, the decoder means 2 output is enabled to the low logic level and actuates all six switching means, whereby the X input $G'_X$ signal is connected to the $G_{ZS}$ output 48c, the Y-gradient input signal $G_Y$ is connected to the $G_{XS}$ output 48a and Z-gradient signal input $G'_Z$ is connected to the $G_{YS}$ output 48b. This has the effect of rotating the gradients to the "right" in the gradient matrix and provides an experiment slice of constant thickness in the X direction, for a normal sagittal view. The use of a trio of short pulses, following a long resetting pulse, rotates the input-output signals to the "left" in the gradient matrix and provides a slice of constant thickness in the Y direction, providing a normal coronal view. Similarly, and specifically as shown in the table of FIG. 3a, a quartet, pentad or hexad of short pulses following one or more resetting long pulses cause a gradient matrix swapping operation, respectively between the X and Z axes, the Y and Z axes or the X and Y axes, to provide a rotated sagittal view, a rotated coronal view, or a rotated axial views, respectively.

It will now be seen that, if the gradient-field coil means 12 and the associated gradient power supply means 14 are set such that each of the gradient signals $G_{NS}$ (where N=X, Y or Z) thereto causes the gradient to have a constant and predetermined spatial displacement per unit input magnitude factor, e.g. one millimeter of separation between voxels for a one volt difference in gradient-field input signal $G_{NS}$, the gradient signals can be freely switched between the various axes' power supply/coil means and provide a substantially undistorted image for all six image-slice directions. It should be understood that, even if the gradient power supply/coil means is linearized for a linear gradient field per unit input relationship, e.g. a one gauss difference in gradient field for each one volt gradient signal $G_{NS}$ difference, any resulting distortion when switching between slices (having constant thicknesses in each of the three different axial directions) can be alleviated by the use of different coefficients $K_n$ downloaded into the various registers of interface means portion means 40-3, 40-4 and/or 40-5, to provide a gradient characteristic of constant voxel separation distance per unit of constant input signal difference.

The RF Spectrometer

Referring now to FIGS. 4, 4a, 4b and 4c, the magnetic resonance spectrometer means 26 of our presently preferred system embodiment includes, as previously discussed, an RF transmitter means 26a, a receiver means 26b and a common portion 26c. Common portion 26c includes a frequency synthesizer means 160, such as a PTS160 digitally-programmable frequency synthesizer and the like, having a frequency-control input port 160a for receiving digital information from the spectrometer input 26-3, for establishing the exact frequency of the high-spectral-purity RF signal at the RF output 160b thereof. The substantially-constant-amplitude RF signal at output 160b is provided to the input 162a of an RF signal splitter means 162, having a pair of outputs 162b and 162c at which a pair of RF signals appear which are each a portion of the input signal having the same frequency thereof, but with lesser amplitude and substantially 0° phase shift, therebetween. First RF splitter means output 162b is connected to spectrometer means common portion output 26-1, and thence, via cable 24c, to the receiver means local oscillator input 26b-2. The second RF splitter means output 162c is connected to spectrometer means common portion output 26-2 and thence, via cable 24d, to transmitter means oscillator input 26a-2.

Spectrometer transmitter means 26a receives the carrier signal at input 26a-2 for connection to the input 164a of a phase shifter means 164. Phase shifter first and second outputs 164b and 164c are in phase-quadrature with one another, i.e. the phase of the signal at output 164c is rotated 90° with respect to the phase of the signal at output 164b; a phase shift adjustment 164d is included to adjust the transmitter phase shift $\Phi_t$ of means 164 to be exactly 90° between outputs 164b and 164c. Phase shift means output 164b is connected to the RF input 166a of a first gated RF amplifier means 166, having a second input 166b receiving a channel A, or I-channel, gating CHA signal from the pulse-shape/gate input port 26a-3 on a first line 26a3a; the CHA gate signal is also applied to a gating input 168a of an I-channel gated modulator means 168. The RF input 168b of the I-channel gated modulator means receives the gated RF signal from the first amplifier output 166c. A second gating input 168c of the first gated modulator means receives an I-channel pulse-shaping PS-I analog signal on another line 26a-3b from input port 26a-3. When an enabling logic level is present at the CHA input, the I-channel transmitter carrier is gated into the first gated modulator means, wherein the carrier amplitude is modulated with the desired pulse-shape waveform of the PS-I signal; the gated and modulated I carrier signal waveform appears at the gated modulator output 168d. Similarly, the guadrature Q-channel carrier at output 164c of the phase shifter means is applied to the RF input 170a of a second gated RF amplifier means 170, having a gate control input 170b receiving a channel B, or Q-channel, gating CHB signal on a third line 26a-3c from the pulse shaping/gating input port 26a-3 of the transmitter means. The CHB gate signal is also applied to a first input 172a of a second gated modulator means 172, having an RF input 172b receiving the gated Q-channel output signal from output 170c of the second gated RF amplifier means. The second gated modulator means 172 also has a modulation input 172c receiving the quadrature-channel pulse-shaping PS-Q analog signal on a fourth line 26a-3d from input port 26a-3. Responsive to a gate-enabling logic level of the Q-channel gate enabling signal CHB, the RF carrier is gated into modulator means 170 and is amplitude-modulated therein by the Q-channel pulse-shaping waveform signal PS-Q. The gated and modulated quadrature carrier is provided at second gated modulator means output 172d. Each of gated modulator means 168 and 172 are typically of a double balanced modulator/mixer nature, whereby the amount of unbalanced-carrier fed through the gated-off modulator (responsive to a disabling logic level CHA or CHB signal at respective inputs 168a or 172a) can be minimized. We have found that having separately gated and modulated I-channel signals for producing "90° RF" signals, e.g. for use at 90° nonselective or selective pulse RF drive and the like, and separate gated and modulated Q-channel signals for providing "180° RF" signals, e.g. for use as selective or non-selective 180° RF drive and the like (with rectangular, Gaussian, sinc-function and the like envelope shapes), can provide all of the various RF drive signals required in all of the different pulse sequences presently used for NMR experimentation. It should be understood that new RF pulse envelope shapes may be added to our system by programming the system computer means 30 to download the appropriate envelope-shape-defining data into the appropriate PS memory means of the interface means 40; since each memory means can store up to 2048 different points, each with one of 2048 different levels, any particular PS envelope waveform can be easily provided.

The I-channel signal from the first gated modulator output 168d is applied to a first RF input 147a of a gated RF combiner means 174, while the Q-channel second gated modulator means output 172d signal is applied to a second RF input 174b. A radio-frequency combiner means gating (RFC) signal is provided at a gating input 174c, via a fifth line 26a-3e from the input port 26a-3. If the I-channel or Q-channel gated and modulated carrier is present at either one of inputs 174a or 174b, and the RFC signal is provided at an enabling logic level at input 174c, a gated-modulated-gated RF signal is provided at the RF combiner means output 174d, for introduction to the input 176a of a linear transmitter TX amplifier means 176, at the output 176b of which is provided the spectrometer transmitter means output 26a-1 signal to the RF power amplifier means input 20b. By use of gating in the first RF amplifier means 166 or 170, in the modulating means 168 or 172 and in the RF combiner means 174, greater than 50 dB. of carrier suppression can typically be provided between a pair of successive RF signal pulses, regardless of whether the pair of successive pulses are 90° pulses from the I-channel, 180° pulses from the Q-channel or alternate 90°/180° pulses from alternating ones of the I- and Q-channels. The RF amplifier blanking gate ARB signal is provided at transmitter means output 26-a', via a sixth line 26a-3f from the pulse-shaping/gating signal input port 26a-3.

In the receiver means, the carrier signal at input 26b-2 is provided to the input 178a of a second phase shifter means 178. This phase shifter means provides a pair of "local-oscillator" signals at outputs 178b and 178c; this pair of signals is in phase-quadrature with one another, with the phase shift therebetween being adjustable by means of a $\Phi_r$ adjustment 178d. Each of the phase-quadrature "local-oscillator" (LO) signals is provided to the associated one of first and second LO inputs 180a and 180b, respectively, of a receiver subassembly means 180. Within receiver subassembly means 180 (as more specifically shown in FIG. 4a) are a pair of double-balanced demodulator means 182a and 182b, respectively receiving the 0° local-oscillator signal from input 180a or the 90° (quadrature) local-oscillator signal from input 180b at a first input. Both demodulator means receive the input signal from a receiver subassembly means input 180c. Associated with each demodulator means is a balance control 180d or 180e, respectively, for nulling the amount of local-oscillator signal feedthrough of each demodulator. After dividing the input power into this pair of channels (denoted the I-channel and the quadrature Q-channels), the quadrature signals are demodulated against the quadrature LO signals and the resulting audio-frequency output signals (which are thereby phase-sensitively detected in quadrature) are amplified in respective amplifier means 184a and 184b. The amplified I- and Q-channel baseband signals are low-pass filtered in respective low-pass filtering means 186a or 186b and are then further amplified in respective amplifier means 188a and 188b, to provide the received I-channel (RX-I) output 108f signal or the received Q-channel (RX-Q) output 180g signal. The bandwidth (in Hertz) of the low-pass filters 186 is set substantially equal to the number of points sampled per acquisition, divided by twice the duration (in seconds) of the acquition period. The receiver subassembly input 180c receives the amplified signal at the output 190a of a video amplifier means 190, having an input 190b receiving the preamplified signal at receiver means input 26b-1. Inputs 26b-1 and 190b receive the preamplifier signal from the output 22b of preamplifier means 22, which receives the NMR response signal from antenna means 16b at its input 22a. The preamplifier means 22 typically has a noise figure on the order of about 1 dB. and a gain of about 45 dB. to about 55 dB.; the gain of video amplifier means 190 can be adjusted by a gain-adjustment control 190g to provide such additional gain, e.g. about 20 dB., as required. It will be seen that the I-channel output 180f signal can be further amplified in a first differential amplifier means 192a, while the Q-channel quadrature output 180g signal can be further amplified in a second differential amplifier means 192b, to provide a pair of I and Q signals at another output port 26b-4 (shown in FIG. 4 and not shown in the system diagram of FIG. 1 for reasons of simplicity), to an oscilloscope or the like indicating device, to assist in the alignment and set-up of the various spectrometer portions. It should be understood that if reception antenna means 16b (see FIG. 1) comprises a set of orthogonally-positioned reception coils, the received NMR signals from the orthogonal antennae can be separately preamplified and each of the two orthogonal received signals can be themselves quadrature-detected to yield a total of four separate channel signals, i.e. a first antenna pair of phase-quadrature signals $I_1$ and $Q_1$, and a second orthogonal antenna pair of phase-quadrature signals $I_2$ and $Q_2$. The four channel signals will then be power-combined into two channels, the I'-channel and the Q'-channel, using the relationships: $I'=I_1+Q_2$; and $Q'=Q_1+I_2$, to obtain a further $\nu 2$ improvement in signal-to-noise ratio. The I' and Q' signals then replace the I and Q signals at receiver means output port 26b-3, for introduction into the interface means digitizer portion means 40-2, discussed hereinabove.

Figure 4:
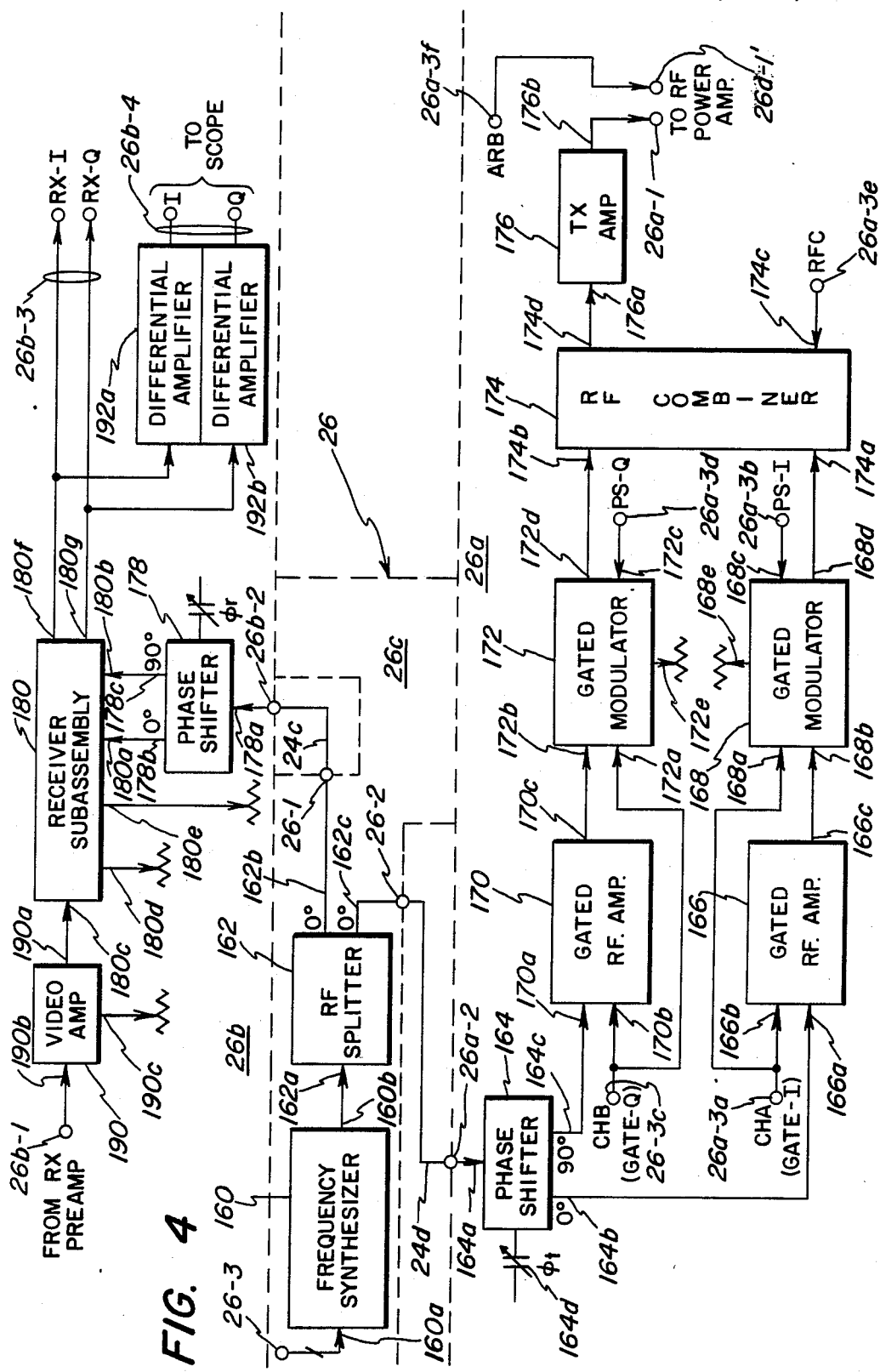
FIG. 4 is a schematic block diagram of one presently preferred NMR spectrometer for use in the present invention.
Figure 4A:
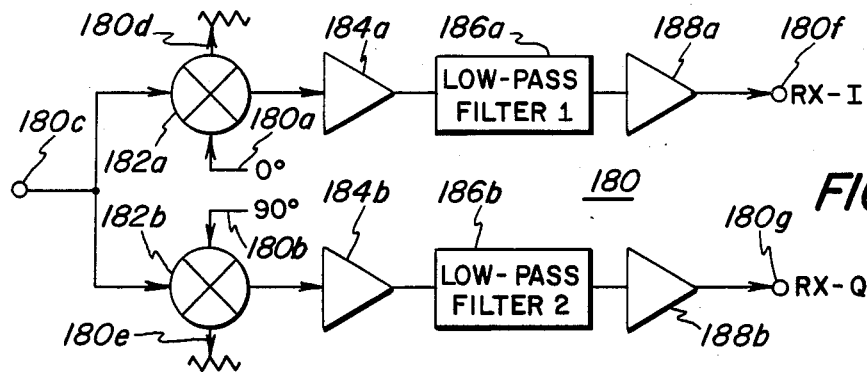
FIGS. 4a, 4b and 4c are schematic block diagrams of one presently preferred embodiment of, respectively, a receiver subassembly, a power amplifier means and a transmit/receive switching means for allowing use of a single radio-frequency antenna means in a high-field NMR system.
Figure 4B:
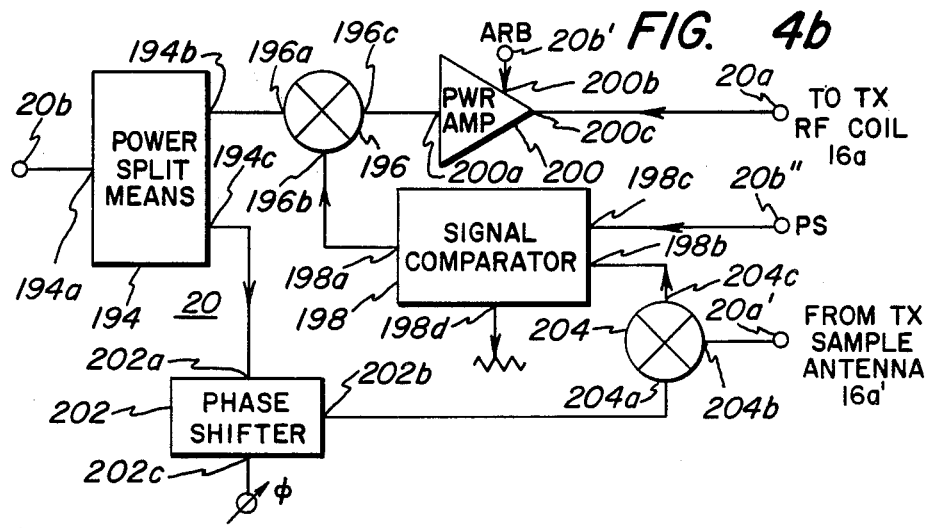

Referring now to FIG. 4b, the RF power amplifier means 20 receives the gated and modulated RF driving signal at a signal input 20b and also receives the ARB amplifier and receiver blanking signal at an input 20b'. The amplifier-enabling ARB gating signal, for one particular 5 kilowatt broadband, high gain amplifier (model 2000LM8, from Amplifier Research Inc.) used, is required to commence 40 microseconds prior to, and be present during, each of the RF pulses provided at RF power amplifier means signal input 20b, to enable the amplifier for high power operation and to simultaneously generate a receiving RX preamplifier means blanking signal at output 20c, if such blanking signal is required. While not shown in FIG. 1, for reasons of simplicity, the presently preferred power amplifier means 20 also receives the pulse-shaping PS signal at another input 20b'', from transmitter means 26a; the excitation antenna means 16a advantageously contains a transmitter TX sampler antenna subsection which provides, over a cable not shown, a transmitter sample signal to an auxiliary input 20a' of the power amplifier means.

The gated and modulated RF carrier excitation signal at input 20b is applied to the input 194a of a power splitter means 194. A first power splitter means output 194I b is applied to an RF input 196a of a controlled attenuator means 196. Controlled attenuator means 196 may be a double-balanced mixer, operated in its controlled attenuator mode, or the like, whereby the internal attenuation thereof is responsive to the magnitude of a DC current at a control input 196b for establishing the magnitude of RF attenuation between an input 196a and an output 196c. The control current at input 196b is provided at the output 198a of a pulse comparator 198. The variable RF signal at attenuator means output 196c is applied to the input 200a of the main RF power amplifier 200. The ARB gating signal from input 20b' is applied to the blanking gate input 200b of the power amplifier. Responsive to the magnitude of the excitation signal at input 200a, only during the presence of the ARB signal at input 200b, a linearly-amplified carrier signal is provided at power amplifier output 200c for connection to the power amplifier means output 20a, and thence to the excitation antenna 16a within the magnet means bore. Because such factors as the thickness of the sample slice are controlled by the pulse-shaping PS modulation waveform characteristics, it is extremely important that the RF excitation magnetic field actually produced by excitation antenna 16a have essentially the modulation envelope established by the PS modulation waveform. Therefore, the actual pulse-shaping modulation PS signal waveform is introduced, at input 20b'' and thence at the first input 198b of signal comparator means 198, for comparison to a video signal generated responsive to a sample of the actual excitation RF magnetic field, provided by the sample antenna 16a' at auxiliary input 20a'. This signal comparison is facilitated by providing a sample of the power amplifier means excitation signal at a second power splitter means output 194c. This excitation signal sample is introduced to the input 202a of a phase shifter means 202. The phase-shifted excitation sample signal appears at the phase shifter means output 202b with an amount of phase shift $\Phi_s$ established responsive to the setting of a phase shift control 202c. The phase-shifted excitation sample signal is introduced into a first input 204a of a mixing means 204, receiving the antenna sample signal, from auxiliary input 20a', at a second input 204b. The sample signal phase shift $\Phi_s$ is set to produce a sampled video signal, at mixer means output 202c, which is representative of the actual excitation RF magnetic field generated by coil 16a (as sampled by antenna 16a'). This actual sampled signal pulse-shape waveform is provided to a first input 198b of signal comparator means 198. The original pulse-shape PS waveform at the signal comparator means second input 198c is compared against the actual pulse-shape waveform at first input 198b, sot that signal comparator means 198 develops, responsive to the difference between the desired PS and actual envelope video signals, a signal at its output 198a for correction of the attenuation of attenuator means 196. Thus, by use of attenuator means 196, signal comparator means 198, phase shifter means 202 and mixer means 204, automatic amplitude-level-correction of the excitation RF field magnitude is achieved. Advantageously, signal comparator means 198 includes a control 198d for setting the magnitude of the signal at signal comparator output 198a to some average level, to cause attenuator means 196a to have some resting attenuation value $\alpha_r$ greater than the minimum attenuation and less than the maximum attenuation thereof, such that attenuation means 196 can be controlled both lesser and greater attenuation values, relative to the $\alpha_r$ resting value, to control the linear amplification gain in both increasing and decreasing directions. The additional resting attenuation $\alpha_r$ of attenuator means 196 is compensated for by either increasing the amplification factor of power amplifier 200 (which may cause undesired unstability or non-linearity therein) or, more advantageously, by a coordinated increase in the gain of TX amplifier means 176, to increase the absolute signal level at power splitter means first output 194b.

Figure 4C:
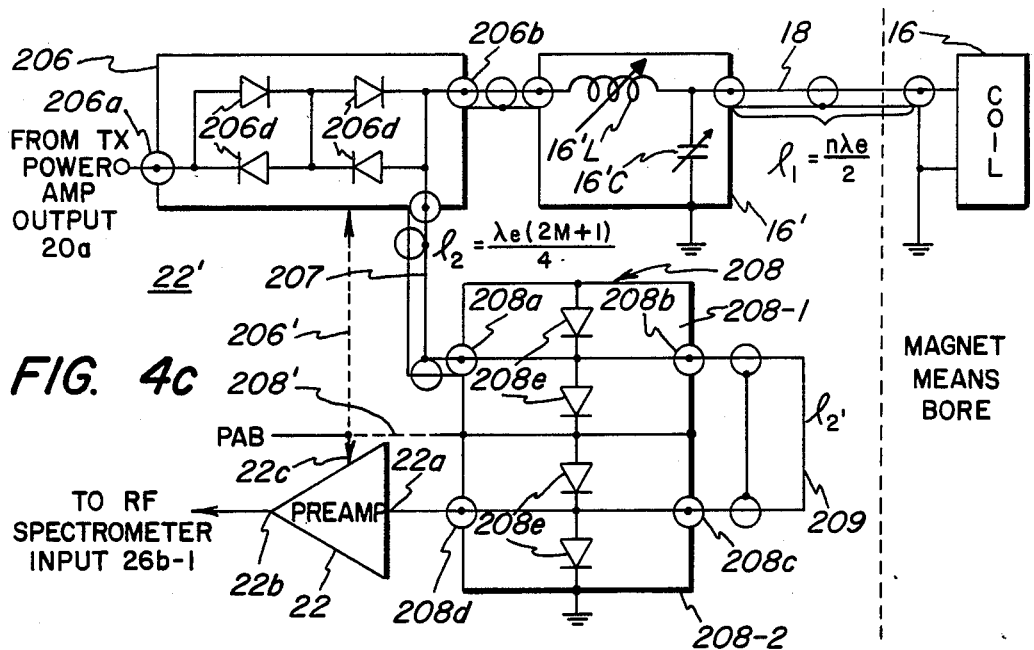

Referring now to FIG. 4c, while separate excitation and reception antennae 16a and 16b are shown in FIG. 1, it should be understood that a single antenna means 16, such as a solenoidal coil and the like, can be utilized for both excitation and reception functions. The signal coil 16, located within the magnet means bore (or, more specifically, within the gradient coil means bore 12a), as well as separate antennae 16a and 16b, can be utilized with an impedance-matching means 16', comprised of substantially lossless reactive elements, such as variable inductances 16'L and variable capacitances 16'C, to match the actual impedance of antenna 16 to a standard cable impedance, e.g. 50 ohms. Advantageously, the single cable 18, between the antenna 16 (located within the magnet means or gradient coil means bore) and the impedance-matching network means 16' located external to the bore (or the cables 18a and 18b of FIG. 1) each has a length $l_1$ which is not only long enough to extend from the at least one antenna means 16 within the bore to the network means 16' (or to the preamplifier means 22 and from power amplifier means 20), but is also an integer multiple of one-half the effective wavelength of electromagnetic radiation in the particular cable utilized, at the Larmor frequency (e.g. about 63 MHz for $^1$H imaging in a static magnetic field of about 1.5 T). The integer number n of the effective cable half-wavelengths causes the antenna 16 impedance to appear to be directly at the output of any impedance-matching means 16' utilized, or, alternatively, directly at the power amplifier means output. In addition to the protective effect of the power-amplifier-enabled blanking PAB signal provided to preamplifier means blanking input 22c, additional protection from the highpower RF excitation pulses can be obtained through the use of RF gating means 206 and 208, located between the transmission power amplifier output 20a, the received preamplifier input 22a and the RF antenna means 16. This additional isolation protection is especially advantageous in the case where a single antenna means 16 is used for both excitation and reception. The additional "isolation" means 206 and 208 can either be actively-gated means, responsive to the PAB signal (as shown by the broken PAB input lines 206' and 208'), or can be passive isolation means as shown. A first passive isolation means 206 has an input 206a receiving the high-power RF excitation pulse from the transmitter power amplifier output 20a. The passive isolation means output 206b is connected to the antenna 16, through any intermediate impedance-matching means 16' and cable 18. The common antenna port 206b is also directly connected to the reception output port 206c, and is connected through a plurality of gating elements 206d, such as anti-parallel-connected RF switching diodes and the like, to power amplifier input 206a. The receiver output port 206c is connected to the input port 208a of the second passive isolation means 208 through a cable 207 having a length $l_2$ equal to an odd multiple of an effective quarter-wavelength of the particular cable utilized. Thus, $l_2 = \lambda_e(2M+1)/4$, where M is an integer and $\lambda_e$ is the effective wavelength, at the average Larmor frequency, of the particular cable utilized. The output 208b of a first portion 208-1 of the second isolation means is connected through another cable 209, having a length $l_2'$ (another odd quarter-wavelength multiple of the effective cable wavelength at the average Larmor frequency used) to the input 208c of a second isolation means second portion 208-2. The second isolation portion output 208d is connected to the reception preamplifier input 22a. Each of second isolation means first and second portions 208-1 and 208-2 respectively contain a plurality of shunt elements 208, such as anti-parallel-connected RF switching diodes, connected between the active conductor of the isolation means portion and RF ground potential. In the absence of a high-power RF pulse from power amplifier means output 20a, first isolation means series diodes 206d provide an open-circuit condition between input port 206a and ports 206b–206c. Port 206b is directly connected to port 206c, so that any reception signal at antenna means 16 is provided in substantially unattenuated manner at second isolation means input 208a. The second isolation means diodes 208e are in the open-circuit condition, whereby the reception signal at input 208a appears at output 208d and preamplifier input 22a, as required. Conversely, during the presence of a high-power RF excitation pulse at input port 206a, diodes 206d conduct to the substantially short-circuit condition, connecting port 206a to port 206b, whereby the excitation signal is provided to the impedance-matched antenna means in substantially unattenuated manner. The full power of the excitation signal also, unfortunately, appears at first isolation means output port 206c; however, the signal level effectively causes diodes 208e to conduct, whereby short-circuits are provided at second isolation means ports 208a, 208b and 208c. The short-circuit condition at port 208c is reflected back along cable 209 to appear (because of the odd-multiple-quarter-wavelength) as a substantially open circuit at port 208b. The resulting short-circuit condition at port 208a is reflected back along cable 207 to appear at port 206c as a substantially open-circuit condition. Accordingly, the vast majority of excitation power flows out of first isolation means port 206b, with only a few watts (i.e. the power amplifier means RF output power reduced by the first isolation means 206 actual isolation of about 30 dB.) to port 206c. This attenuated power is further reduced by the attenuation through the second attenuation means first portion 208-1 and then through the second portion 208-2. As each portion of second isolation means 208 can easily achieve an isolation attenuation of at least 20 dB., the power amplifier means output power level of between about 60 dBm. and about 70 dBm. is attenuated by at least 70 dB., such that the residual power level applied to the blanked preamplifier input 22a is on the order of 1 milliwatt (a level easily tolerated by low-noise receiving preamplifiers utilizing GaAs FET devices or even silicon FET or bipolar devices). In this manner, rapid passive switching of a single antenna means 16 between excitation and receive functions, responsive to the high-power excitation RF signal, is provided.

Exemplary Imaging and Spectroscopy Methods for High-Field NMR System

Referring now to FIGS. 5-9, several exemplary methods will be described for NMR imaging or NMR chemical-shift spectroscopy utilizing our novel high-field system. It should be understood that these methods, and the particular magnetic gradient field signals, RF magnetic field signals (and gating/modulation waveforms therefor) and the like signals are presented by way of example only and are neither intended to limit the methods and/or signal waveforms utilized, nor limit the system to apparatus capable of performing only the illustrative method(s).

Figure 5:
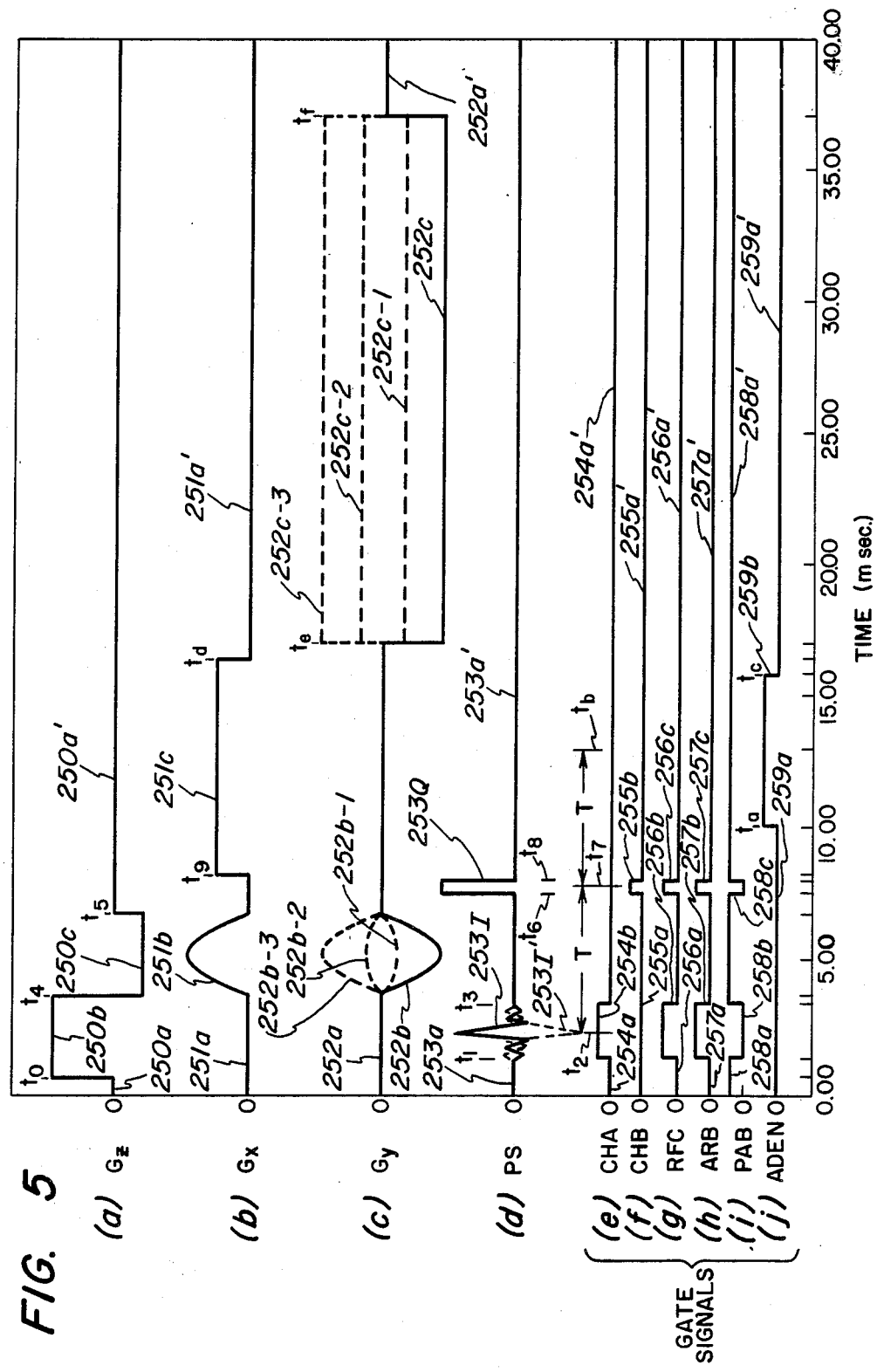
FIGS. 5–9 are graphical illustrations of the various signals typically found at various points within the system for several presently preferred and different methods of producing NMR images and localized chemical shift spectra from anatomical samples, utilizing the high-field system.

Referring first to FIG. 5, the field gradient ($G_z$, $G_x$ and $G_y$), pulse-shaping (PS) and gating (CHA, CHG, RFC, ARB, PAB and ADEN) signals for a partial-saturation two-dimensional (2D) spin-warp imaging sequence are illustrated. While several aspects of the imaging method utilizing this sequence of signals are more fully described and claimed in U.S. Pat. No. 4,443,760, issued Apr. 17, 1984, assigned to the assignee of the present application and incorporated herein by reference in its entirety, the method may briefly be described as follows: prior to the beginning of each imaging sequence (commencing at time $t_0$), all of the gradient $G_z$, $G_x$ and $G_y$ waveforms, as well as the pulse-shaping PS waveform and the gate signal waveforms CHA, CHB, RFC, ARB, PAB and ADEN, are at an essentially zero magnitude level, as shown by waveform portions 250a–259a, respectively. At first sequence commencement time $t_0$, the gradient field signal in the direction of the axis along which the constant sample slice thickness is to be provided, e.g. the $G_z$ signal for an axial slice with constant thickness in the Z-direction, is pulsed to a positive polarity level, as shown by waveform (a) portion 250b. In the presence of the gradient pulse 250b, a 90° RF selective excitation pulse is provided by enabling the transmitter means I-channel with the CHA waveform portion 254b of waveform (e), the RF combiner RFC enabling waveform portion 256b of waveform (g), the RF power amplifier means ARB enabling signal portion 257b of waveform (h), the preamplifier blanking PAB signal portion 258b of waveform (i) and a non-zero pulse-shaping signal level in the I-channel, such as the waveform (d) signal portion 253I (having a sinc modulation envelope), which is also present in the Q channel as required. The pulse-shaping I-channel modulation envelope portion 253I commences at a time $t_1$ after the sequence commencement time $t_0$ and terminates at a time $t_3$ prior to the $G_z$ gradient pulse termination time $t_4$, with the pulse-shaping waveform reaching a peak at a time $t_2$ substantially midway between time $t_1$ and $t_3$. The combination of the selective excitation 90° RF pulse of narrow bandwidth and in the presence of a positive $G_z$ field gradient excites the desired thin slice of spins perpendicular to the Z axis. The slice thickness is dependent upon the amplitude of $G_z$ signal portion 250b and the duration ($t_3-t_1$) of the 90° pulse. Sample plane excitation is followed by an information-encoding interval (commencing at time $t_4$ and terminating at time $t_5$) during which the $G_z$ signal is provided as a negative-polarity gradient, as in portion 250c, along with a positive $G_x$ field gradient signal portion 251b and a Y-direction phase-encoding field gradient pulse portion 252b of waveform (c). The $G_z$ portion 250c has a magnitude established in accordance with the equation $$\tfrac{1}{2}\int_{t_1}^{t_3} G_z(t)dt = \int_{t_3}^{t_5} G_z(t)dt,$$

to facilitate rephasing of the excited nuclei spins. The waveform (b) positive $G_x$ portion 251b acts as an excited nuclei dephasing pulse while the phase-encoding $G_y$ pulse 252b is provided with a magnitude selected to encode spatial information in the Y-direction. The pulse-shaping PS signal and all of the six gate signals are at a substantially zero magnitude during the appearance of the three gradient pulses. Upon termination of the three-gradient-pulse period (at time $t_5$) a short time interval (until time $t_6$) is provided for the gradient signals (primarily the $G_z$ signal) to return to the substantially zero level, e.g. the final $G_z$ field gradient level 250a'. At time $t_6$ a non-selective 180° RF pulse is applied by providing enabling a waveform (f) signal portion 255b and signal portions 256c, 257c and 258c in the respective CHB, RFC, ARB and PAB gate signals and by the appearance of a substantially-rectangular Q-channel pulse-shaped modulation signal 253Q; the 180° non-selective RF pulse, applied in the absence of any imaging gradients $G_n$ (where $n=x$, y or z) serves to rephase the nuclei spins dephased by inhomogeneities inherent in the main magnetic field. The 180° RF pulse signal portions 253Q, 255b, 256c, 257c and 258c are all applied such that the pulse is substantially symmetrical about mid-time $t_7$, which is established to occur after a time interval T from the time $t_2$ at which the 90° RF selective pulse peak occurs. Responsive thereto, the stimulated nuclei generate an NMR echo signal having a maximum amplitude occurring at a time 2T after the midpoint of the 90° RF selective pulse, or after a time interval T after the non-selective pulse midtime $t_7$. Prior to the occurrence of the echo peak, an X-direction gradient field $G_x$ portion 251c is enabled (commencing at time $t_9$) and shortly thereafter (at time $t_a$) the analog-to-digital digitization of the received signal is begun by the presence of a non-zero ADEN enabling portion 259b of waveform (j). The spin-echo signal peak occurs at the somewhat later time $t_b$, and the spin-echo response signal diminishes to a substantially zero magnitude by a time $t_c$ at which the ADEN digitizing enablement signal returns to the disabling final level 259a'. Shortly thereafter, at time $t_b$, the $G_x$ field gradient level falls to the substantially zero final level of portion 251a'. It should be understood that the amplitude of the $G_x$ dephasing pulse portion 251b is adjusted to ensure that the spin-echo maxima occurs at the same time interval T after the middle of the non-selective pulse, as the time interval T between the midpoints of the selective and non-selective RF pulses, and the "steady" $G_x$ level of portion 251c is selected to maintain the phase during the spin-echo signal presence. The sequence ends with the large field gradient pulse 252c in either the Y-direction $G_y$ signal, as shown, or in the Z-direction $G_z$ signal; these pulses 252c are "spoiler" pulses serving to destroy the phase coherence of the transverse magnetization and prepare the sample for the next application of the imaging sequence. It will be seen that all of the three field gradient signals of waveforms (a), (b) and (c) have returned to their initial, substantially zero values, in portions 250a', 251a' and 252a', respectively, and that the modulation and gate signals of waveforms (d)–(j) have returned to their substantially zero levels in portions 253a'–259a', at the end of the sequence and are thus at the proper levels for the commencement of the next subsequent partial-saturation two-dimensional spin-warp imaging sequence. Thus, after the "spoiler" pulse ends at time $t_f$, a next sequence of signals 250–259 commences, with a different $G_y$ phase-encoding gradient pulse amplitude, e.g. such as different amplitudes 252b-1 through 252b-3 (shown in broken line), and associated subsequent spoiler pulses, e.g. such as spoiler pulses 252c-1 through 252c-3 (also shown in broken line), each having the same magnitude as the peak magnitude of the phase-encoding gradient pulse 252b-1 through 252b-3, associated therewith, and with the phase of the selective 90° pulses being alternated, as shown by the negative-polarity peak sinc bt pulse-shaping PS modulation waveform 253I' (shown in broken line). A total of $N_y$ different values of the $G_y$ phase-encoding gradient pulse portion 252b is utilized to provide $N_y$ sequential spin-echo reception signals, each of which is complex Fourier transformed, with respect to time, to yield a different one of $N_y$ projections. A second Fourier transform is then performed with respect to $G_y$ amplitude to generate the two-dimensional NMR image. The repetition period between applications of the illustrated sequence, i.e. the time between the commencement time $t_0$ of a first imaging sequence and a time $t_0'$ of the next subsequent imaging sequence, is adjusted to optimize the contrast for images of the spin-lattice relaxation time constant $T_1$, coordinately with optimization of the signal-to-noise ratio of the image.

The resulting image typically contains an array of 256×256 pixels (representing an area of between about 5 cm. and about 75 cm. on each side) with a typical thickness of between about 0.5 mm. to about 15 mm.

Figure 6:
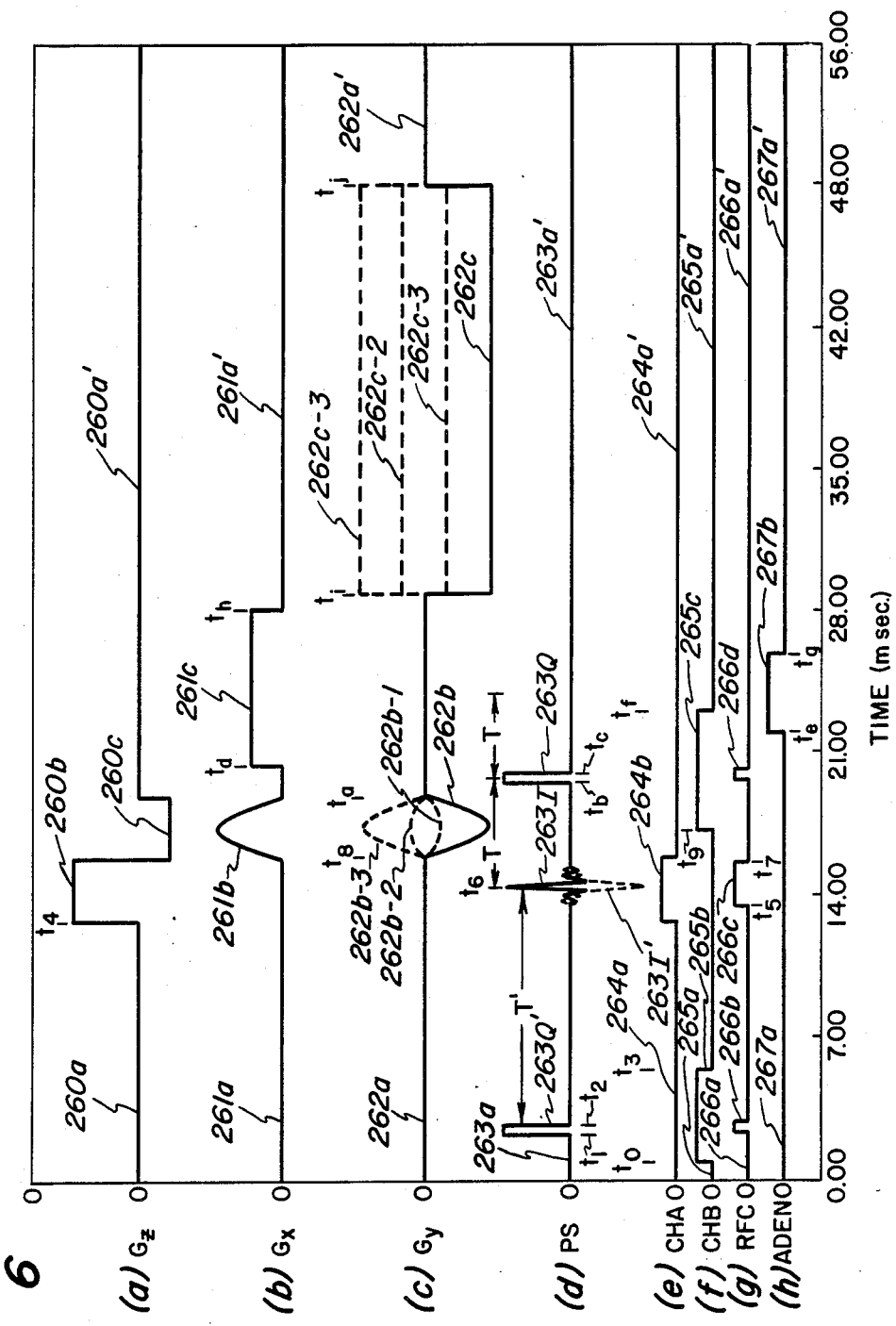

Referring now to FIG. 6, the signals for a two-dimensional inversion-recovery spin-warp imaging sequence are illustrated. The inversion-recovery sequence is substantially the same as the sequence of FIG. 5, with the exception that an additional 180° non-selective RF pulse 263Q-1 is applied at a time T' prior to the time $t_6$ at which the peak of the 90° selective RF pulse 263I occurs. During the time interval T', excited nuclear spins throughout the sample recover their Z-direction magnetization at a rate dependent upon the spin-lattice time constant $T_1$ of the particular nuclear spin; spin-lattice relaxation time constant $T_1$ images can be constructed by varying the time interval T' in subsequent scan sequence experiments. It will be seen that the waveforms of FIG. 6 do not show the ARB waveform, which is (as shown in FIG. 5) essentially identical to the RFC waveform in commencement, termination and magnitude of the enabling and disabling levels; it will be further seen that the preamplifier-blanking PAB signal also need not be specifically shown, as the PAB signal is the logic inverse of the RFC/ARB signal. It will be seen that the 13 individual time intervals required for the partial-saturation 2D spin-warp imaging sequence of FIG. 5 (requiring 13 interrupt-driven subsequence instruction sets to be loaded from the computer means 30) become 19 different time intervals, each requiring a separate set of instructions loaded into the interface means by the computer means of the high-field NMR imaging system. Specifically, prior to the beginning of each imaging sequence (commencing at time $t_0$), all of the gradient $G_z$, $G_x$ and $G_y$ waveforms, as well as the pulse-shaping PS waveform and the gate signal waveforms CHA, CHB, RFC and ADEN, are at an essentially zero magnitude level, as shown by waveform portions 260a–267a, respectively. At a first sequence commencement time $t_0$, the second transmitter channel CHB signal waveform is provided at the enabling high logic level, as shown by portion 265b of waveform (f). The first RF channel CHA signal waveform remains at the disabling, low logic level, as shown by waveform portion 264a, while the pulse envelope PS signal waveform portion 263a, the combiner gating RFC waveform signal portion 266a and the gradient field signal portions 260a–262a all remain at the low logic level; the analog-to-digital conversion signal portion 267a also remains at the disabling level. These various waveforms are shown in waveforms (a)–(h) of FIG. 6. At some later time $t_1$, the RF combiner gate RFC signal is enabled to a high logic level, as in portion 266b, while the pulse-shaping PS signal portion 263Q' is brought to a level to initiate a non-selective 180° RF excitation pulse. This 180° RF pulse ends at time $t_2$, at which time the RFC pulse 266b also terminates, and the CHB signal returns to a low logic level and the transmitter is temporarily disabled. At a later time $t_4$, the Z-axis gradient $G_z$ signal is pulsed to a positive polarity level, as shown by waveform (a) portion 260b; and slightly later the first transmitter channel CHA enabling level portion 264b, of waveform (e), commences. Shortly thereafter, at a time $t_5$, the combiner RFC signal portion 266c commences, as does the pulse-shaping modulation waveform portion 263I of waveform (d); responsive to the presence of the gradient pulse 260b along with a 90° RF selective excitation pulse (illustratively if the sinc bt modulation envelope type), the desired thin slice of nuclear spins, perpendicular to the Z axis, is excited in the sample. As before, the slice thickness is dependent upon the amplitude of $G_z$ signal portion 260b and the duration ($t_7$–$t_5$) of the 90° pulse. The 90° RF pulse occurs with its peak time $t_6$ being a predetermined time interval T' from the commencement at time $t_1$ of the first 180° non-selective RF pulse (of portion 263Q') of the waveform (d) signal. Thus, after the nuclear spins in the selected sample slice have been first inverted, the recovering inverted spins are now subjected to a 90° rotation into the XY plane. This rotation into the plane of the receiving coil essentially ends at time $t_7$, when the PS signal portion 263I and the RFC portion 266c terminate. Slightly thereafter, at time $t_8$, the rephasing $G_z$ lobe 260c commences, along with the commencement of the $G_x$ signal portion 261b and the $G_y$ signal portion 262b; all of the gradient signals end at a later time $t_a$. At time $t_9$, substantially occurring at the peaks of the $G_x$ portion 261b and $G_y$ portion 262b signals, the quadrature channel CHB signal rises to an enabling level in portion 265c. Therefore, at a time $t_b$ after the gradient signals have returned to their zero-magnitude levels, the pulse-shaping PS signal portion 263Q and the RFC signal portion 266d occur to provide a second non-selective 180° RF excitation pulse. This pulse terminates at a time $t_c$ such that the time interval T between the peak of the 90° selective and 180° non-selective RF pulses 263I and 263Q provides for a spin-echo at a like time interval T after the last 180° RF pulse. Prior to the occurrence of the spin-echo peak, an X-direction gradient field $G_x$ portion 261c is enabled (commencing at time $t_d$) and shortly thereafter (at time $t_e$), the analog-to-digital conversion process commences, responsive to the enabling high logic level portion 267b of the ADEN signal. The digitization of the received signal terminates at time $t_g$, with the X-axis gradient signal portion 261c being terminated at a time $T_h$ thereafter; a spoiler pulse portion 262c, in the Y-axis gradient $G_y$ signal, is generated in the time interval between time $t_i$ and time $t_j$ to destroy the transverse magnetization phase coherence and to prepare the sample for the next imaging sequence, occurring at a time $t_0'$ after the last time $t_j$ of the previous sequence. As in the partial-saturation technique described with respect to FIG. 5, the inversion-recovery technique of FIG. 6 utilizes a total of $N_y$ different values of both the $G_y$ phase-encoding gradient pulse portions 262b and 262b-1 through 262-3, and the identical associated amplitude levels of spoiler portions 262c and 262c-1 through 262c-3 (both shown in broken line), to provide $N_y$ sequential spin-echo reception signals, each of which is complex Fourier transformed, with respect to time, to yield a different one of $N_y$ projections. Again, a second Fourier transform is performed with respect to the $G_y$ amplitude to generate the two-dimensional NMR image. Since the nuclei in the excited sample recover their Z-direction magnetization at a rate dependent upon the different values of spin-lattice time constant $T_1$ thereof, during the time interval T', spin-lattice $T_1$ images are constructed by varying the time interval T' in subsequent scans.

Figure 7:
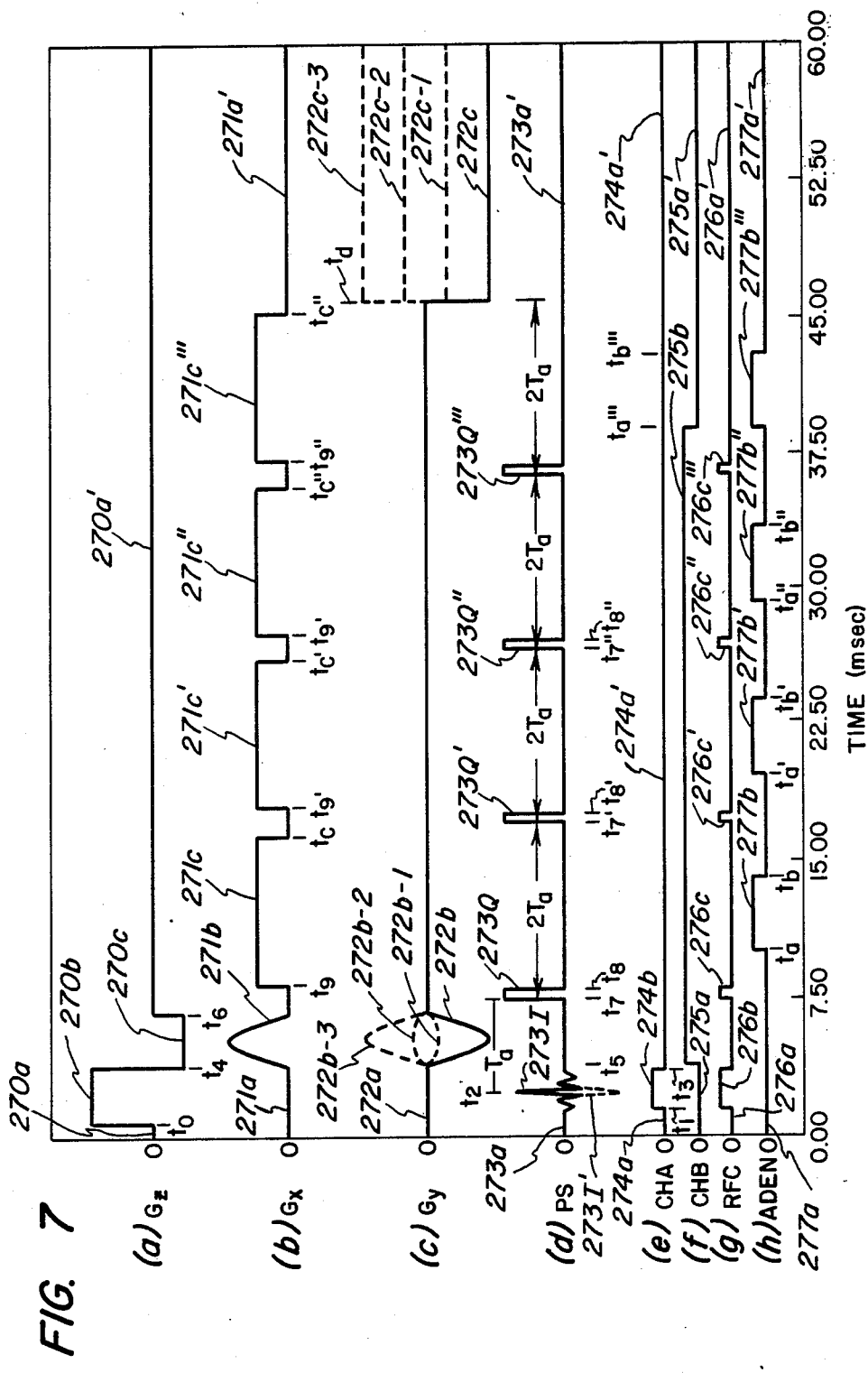

Referring now to FIG. 7, a multiple-echo 2D spin-warp imaging sequence is illustrated. The multiple-spin-echo sequence utilizes a single 90° selective RF excitation pulse, responsive to the PS signal waveform portion 273I, but utilizes a plurality of subsequent 180° non-selective RF excitation pulses 273Q, 273Q', 273Q'', 273Q''', . . . , each occurring with a time interval $2T_a$ therebetween, where $T_a$ is the time interval between the peak of the 90° selective RF pulse modulation waveform (itself occurring at time $t_2$) and the commencement time of the first 180° non-selective RF excitation pulse 273Q. It will be seen that, during each sequence, a plurality of X-axis gradient field $G_x$ signal portions are repeatedly provided at the same level, as in waveform portions 271c, 271c', 271c'', 271c''', . . . , with each portion occurring immediately after the associated 180° non-selective RF pulses 273Q. Similarly, each of a plurality of analog-to-digital conversions is enabled for the associated spin-echo time interval, as shown by the ADEN signal portions 277b, 277b', 277b'', 277b''', . . . in each sequence. Thus, in the illustrated first multiple-spin-echo sequence, a total of four echoes are received and processed; the data from these multiple echoes can be averaged to increase the signal-to-noise ratio of the received information. In a next-subsequent sequence, the Y-axis $G_y$ gradient signal phase-encoding portions 272b-1 through 272b-3 are varied to other ones of the $N_y$ different levels required for formation of the complete image; the same amplitude is also utilized for each subsequent value of one of the spoiler pulses 272c-1 through 272c-3, to prepare for still further sequences. The total of $N_y$ (where $N_y=128$ or $N_y=256$ in typical image production) sequences are each complex Fourier transformed in time and the set of $N_y$ projections are again Fourier transformed with respect to $G_y$ signal amplitude to generate the two-dimensional NMR image. Additionally, a separate image can be constructed from all of the like-numbered echoes, e.g. from the first echo of each of the $N_y$ sequences, from the second echo, . . . ; the decay in image data, with respect to time, can be plotted along the horizontal axis and utilized to compute a transverse relaxation time constant $T_2$ image. It should be understood that this multiple-spin-echo sequence can be combined with an inversion recovery technique by preceding the 90° selective RF excitation pulse (generated in the interval between time $t_1$ and time $t_3$) with a 180° non-selective RF excitation pulse, in the same manner as the initial 180° pulse of the sequence of FIG. 6 preceded the 90° initial pulse of the sequence of FIG. 5.

Figure 8:
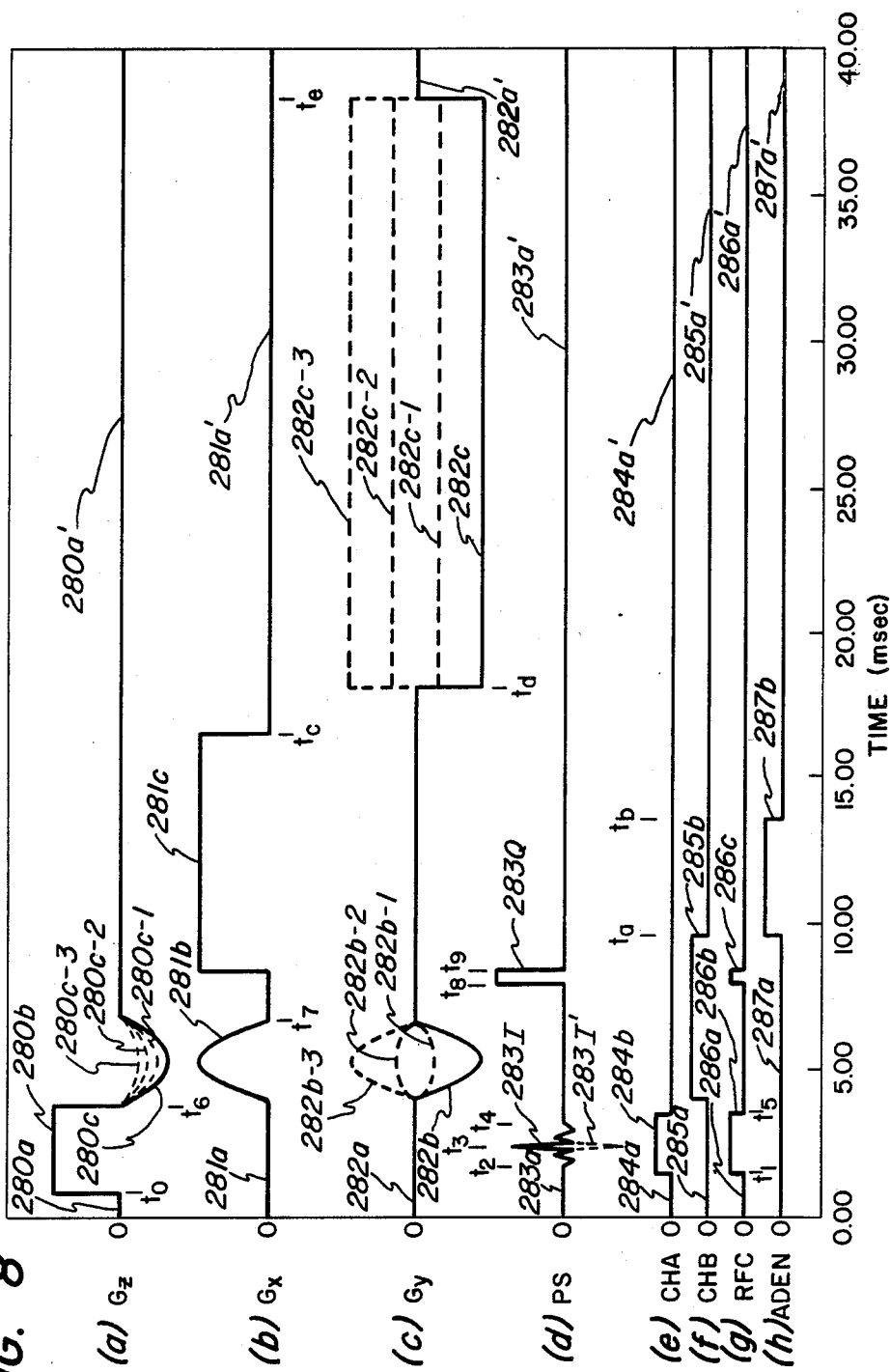

Referring now to FIG. 8, the signals for a restricted three-dimensional (3D) spin-warp imaging sequence are illustrated. It will be seen that this 3D sequence is similar to the 2D sequence of FIG. 5, with the exception of the $G_Z$ gradient signal rephasing lobe 280c (FIG. 8). The Z-axis gradient $G_Z$ signal rephasing lobe portion 280c is a combination of the rectangular rephasing lobe waveform and an additional $G_z$ phase-encoding gradient waveform, to provide the illustrated lobular signal waveform shape; this lobe is present during the time interval from time $t_6$ to time $t_7$ and is concurrent with both the $G_X$ gradient signal lobe 281b and one of the $N_y$ different amplitudes of the $G_y$ gradient signal lobes 282b, 282b-1, 282b-2, 282b-3, . . . , etc. The peak amplitude of gradient signal rephasing lobe portion 280c is (as shown by the various amplitudes of signal lobe portions 280c, 280c-1, 280c-2, 280c-3, . . . ) varied to each of $N_z$ different peak values to obtain $N_z$ different projections. Each of the $N_z$ different $G_z$ gradient signal rephasing lobe amplitude values is utilized with a full range of the $N_y$ peak values for the $G_y$ gradient signal lobes 282b through 282b-3 (and the associated "spoiler" pulse amplitudes 282c through 282c-3). At least $N_y \cdot N_z$ independent projections, utilizing $N_y \cdot N_z$ permutations of the $G_y$ and $G_z$ phase-encoding gradient signals must be collected to reconstruct a three-dimensional image by the 3D Fourier transform (3DFT) method; the data is transformed with respect to: time, $G_y$ amplitude and $G_z$ amplitude. It should be understood that all $N_y$ values of the $G_y$ gradient signal lobes may be sequentially provided for each $G_z$ gradient signal lobe value, or that each of the $N_z$ values of $G_z$ phase-encoding gradient signal lobe 280c may be provided sequentially for each value of the $G_y$ gradient signal phase-encoding lobe 282b, or that any predefined sequence of the $N_y$ phase-encoding $G_y$ gradient signal lobes and $N_z$ phase-encoding $G_z$ gradient signal lobes can be utilized, as long as the computer means 30 has been previously programmed to assign the acquired image data for any particular combination of $G_z$ and $G_y$ signal amplitudes to the appropriate cell of the total data matrix. After collection of at least the $N_y \cdot N_z$ independent projections, the data array (having a like number of $N_y \cdot N_z$ cells) is filled and the 3DFT processing (with respect to time, $G_y$ amplitude and $G_z$ amplitude) is carried out to provide a set of imaging data which can be displayed as a sequence of images with either the Y-axis or Z-axis value varying across the range for which data was taken. It should be understood that the initial 90° selective RF pulse, provided during the time interval between time $t_2$ and time $t_4$ of each of the $N_y \cdot N_z$ sequences, may be so established as to selectively excite all of the nuclei in a relatively thick slab (in the Z direction) of the sample to be imaged, and can be further established to define the number $N_z$ of Z-axis slices to be much less than the number $N_y$ of the Y-axis-parallel columns in each of the $N_z$ planes. It should be further understood that the restricted three-dimensional imaging sequence can be combined with inversion recovery techniques, such as that previously shown in FIG. 6, or with multiple-echo techniques, such as that previously shown in FIG. 7, by the addition of 180° non-selective RF pulses either before or after the 90° selective excitation pulse 283I or 283I' in each sequence. In this manner, a restricted three-dimensional set of images can be obtained with proton distribution, $T_1$-weighted, $T_2$-weighted and the like information, and can be so obtained either with or without signal averaging as provided by multiple-echo techniques.

Figure 9:
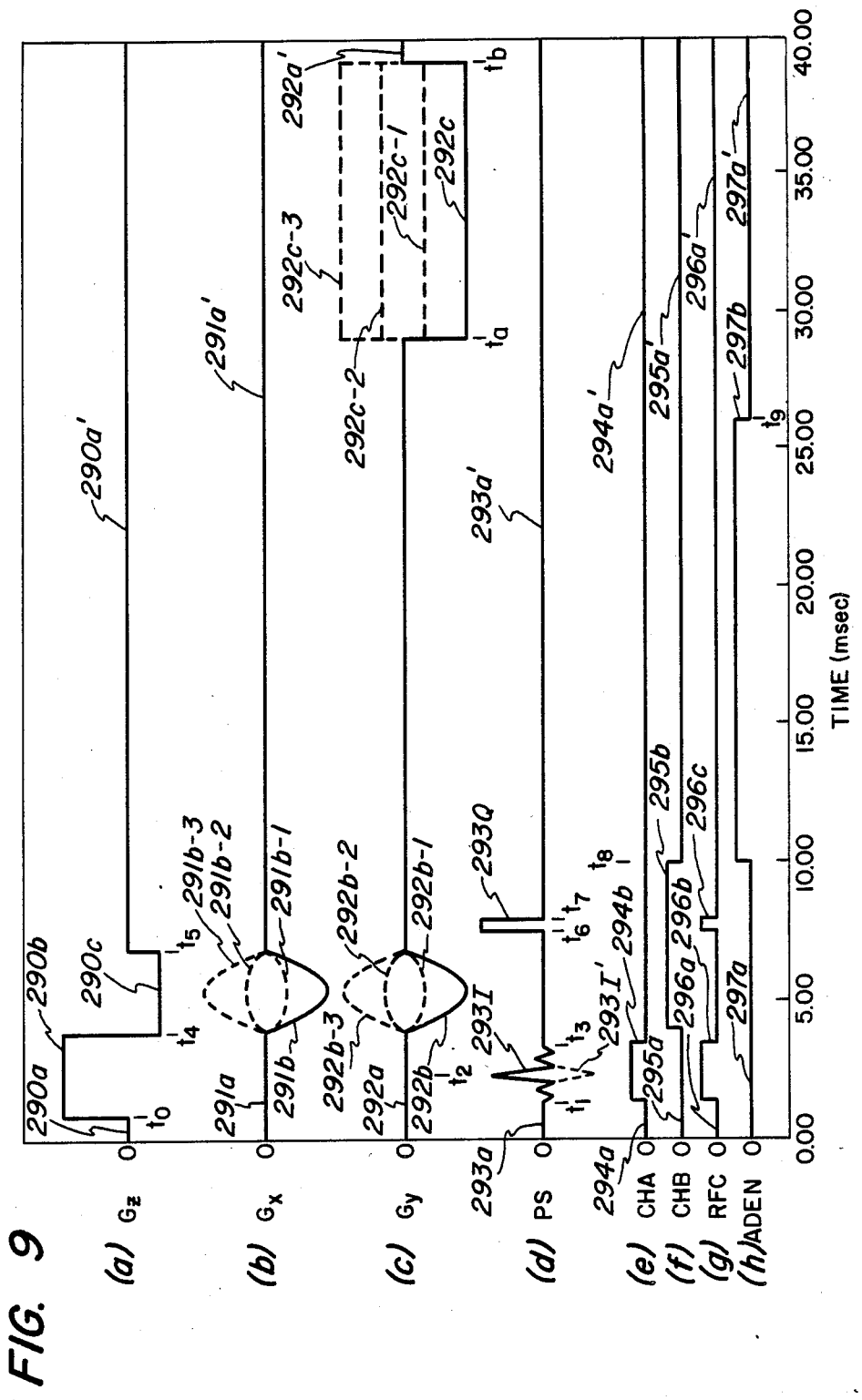

Referring now to FIG. 9, the various system signals for one presently preferred embodiment of a chemical-shift spectroscopic imaging sequence are illustrated. The spectroscopic imaging signal waveforms 290–297 are a modified set of the basic two-dimensional imaging sequence as previously described for FIG. 5. It will be seen, however, that the use of an X-axis gradient field $G_x$ signal is eliminated during the data acquisition time interval, when the ADEN signal portion 297b is at a high logic level (between times $t_8$ and $t_9$), and a phase-encoding $G_x$ gradient field signal lobe 291b (or a sequence-dependent one of a plurality of different magnitude lobes 291b and 291b-1 through 291b-3) is utilized. That one of the $G_x$ is gradient signal lobes 291b, 291b-1, 291b-2, 291-3, . . . , then in use for the particular sequence, is present during the same time interval, from time t₄ to time t₅, during which the $G_z$ gradient signal rephasing lobe 290c and the $G_y$ gradient signal phase-encoding 292b are present. It will also be noted that the data acquisition time interval (e.g. between time t₈ and time t₉) is increased, relative to the basic imaging sequence, to improve frequency resolution of the received image data.

To provide a two-dimensional chemical-shift spectroscopic image, a total of $N_x$ different amplitudes of the $G_x$ gradient signal phase-encoding lobes 291b are utilized, along with $N_y$ different amplitudes of the $G_y$ gradient signal phase-encoding lobes 292b. Thus, the spatial information in the two-dimensional slice is reconstructed by the 2DFT of the $N_x \cdot N_y$ individual response signals, provided by the like number of independent projections using a like number of different permutations of the $G_x$ and $G_y$ gradient field signal lobe amplitudes. A third Fourier transform is performed upon the two-dimensional spatial image information matrix, with respect to data acquisition time, to provide the chemical-shift spectroscopic information at each point in the two-dimensional imaging plane. It should be understood, as with the three-dimensional imaging sequences of FIG. 8, that the chemical-shift spectroscopic imaging sequences of FIG. 9 can be combined with inversion recovery techniques, by adding a 180° non-selective RF signal pulse prior to the 90° selective RF excitation pulse 293I or 293I', at the beginning of each sequence, or can be combined with three-dimensional imaging techniques, by providing a phase-encoding $G_z$ gradient signal lobe in place of the illustrated rectangular rephasing lobe 290c, in addition to the phase-encoding $G_x$ and $G_y$ gradient signal lobes 291b and 292b, respectively. It should also be understood that in the absence of chemical-shifts, i.e. if the imaging volume contains a homogeneous sample, the use of the chemical-shift spectroscopic imaging sequence of FIG. 9 will reveal the magnetic field nonhomogeneity in the imaging plane, allowing the magnetic field nonhomogeneity to be measured as variations in the NMR response signal frequency, with respect to position in that imaging plane; this technique is particularly useful for initial balancing of the magnetic field of the superconducting magnet means. It should be understood that the spin-echo-generating pulse 293Q, in the time interval between times t₆ and t₇ can be omitted, if desired; for example, when acquiring response signals with relatively short T₂ times (e.g. adenosine triphosphate responses requiring acquisition of only the free-induction-decay signal immediately at time t₅—pulses 293Q, 295b and 296c are omitted and pulse 297b commences at time t₅).

While one presently preferred embodiment of our novel high-field magnetic resonance imaging and spectroscopy system, and several presently preferred embodiments of methods for utilizing that system to acquire image data from a sample, have been described in some detail herein, many variations and modifications will now become apparent to those skilled in the art. As just one example, this system allows use of other novel methods, such as the method for localizing NMR chemical shift information by Depth-Resolved Spectroscopy (DRESS), as described and claimed in co-pending application Ser. No. 626,941, filed July 2, 1984, now U.S. Pat. No. 4,629,988, issued Dec. 16, 1986, assigned to the assignee of the present invention and incorporated herein in its entirety by reference. It is our intent, therefore, to be limited only by the scope of the appending claims and not by way of the specific details and instrumentalities presented by way of description of the presently preferred embodiments herein.

What we claim is:

1. A nuclear magnetic resonance system for the production of both localized chemical-shift spectra and at least two-dimensional images, including chemical-shift spectral images, from a non-ferromagnetic sample at substantially a single magnitude of system static magnetic field, comprising:

means for generating said static magnetic field with said magnitude being greater than about 0.7 Tesla (T) in a first direction both in a room-temperature free bore of diameter greater than about 0.4 meters and in said sample when positioned in said bore, said static magnetic field having a spatial homogeneity better than about ±3 parts per million (ppm) and a temporal stability better than about ±1 ppm/hour;

means for temporarily generating three field gradients in the static magnetic field, and comprising: a plurality of gradient coil means disposed about said bore for each producing a different gradient in the magnetic field along one of the X, Y and Z axis of a Cartesian coordinate system having its center positioned within said bore, each gradient coil means being responsive to at least one of X-direction, Y-direction and Z-direction field gradient signals; and means for providing each different one of said field gradient signals with an amplitude responsive to only one associated one of first, second and third gradient excitation signals;

means for providing a radio-frequency (RF) magnetic field, within both said bore and said sample when positioned therein, responsive to an RF excitation signal and having an envelope essentially linearly responsive to, and directly controlled by, the instantaneous amplitude of a pulse signal waveform, and for receiving RF energy re-radiated from the sample for forming a response signal;

spectrometer means for providing the RF excitation signal with at least desired amplitude and frequency characteristics, and for preparing the received response signal for analysis; and computer means (a) for controlling the characteristics of the magnetic field gradient signals and including: means for providing all three of the gradient excitation signals; and means for switching each of said gradient excitation signals to provide a different one of said field gradient signals in a manner to cause the desired image of the sample to have a selected one of transaxial, sagittal and coronal mutually-orthogonal orientations, and in a selected one of normal and reverse directions in the selected orientation, responsive to orientation and direction controlling signals provided by said computer means and without requiring movement of the sample in the bore, (b) for controlling the RF excitation signal, and providing the pulse signal waveform to directly control the RF magnetic field envelope, and (c) for analyzing at least selected ones of the received response signals to provide, as obtained from the sample, at least one of: magnetic resonance chemical-shift spectra information; magnetic resonance image information; and magnetic resonance chemical-shift spectral image information.

2. The system of claim 1, wherein said said static magnetic field has a magnitude less than about 4.0 T.

3. The system of claim 2, wherein the static magnetic field is about 1.5 T.

4. The system of claim 1, wherein said static magnetic field has a spatial homogeneity better than about ±1 ppm across a preselected sampling sphere.

5. The system of claim 4, wherein said static magnetic field has a temporal stability better than about ±1 ppm/hour.

6. The system of claim 4, wherein said static magnetic field has an inhomogeneity of not greater than ±1 ppm in an imaging sphere having a radius on the order 5 centimeters.

7. The system of claim 1, wherein said static magnetic field has a temporal stability better than ±1 ppm/hour.

8. The system of claim 7, wherein said static magnetic field has an inhomogeneity of not greater than ±3 ppm in an imaging sphere having a radius on the order of 15 centimeters.

9. The system of claim 1, wherein said static magnetic field generating means has a room-temperature free bore of diameter less than about 1.5 meters.

10. The system of claim 9, wherein said room-temperature free bore is about 1 meter in diameter.

11. The system of claim 1, further comprising: means for displaying the information analyzed by said computer means as an array of pixels forming an image representation of said sample in the selected orientation and direction; said switching means further providing selection of any of the possible combinations of image representation direction and orientation without moving the sample in the bore.

12. The system of claim 11, wherein said computer means includes: means for storing at least one sequence of data words for controlling the characteristics of said magnetic field gradients and said RF excitation signal to acquire and store information sufficient to provide selected ones of two-dimensional, three-dimensional and four-dimensional image representations of said sample; and means for storing all of the information acquired responsive to each data word sequence, until said information is requested.

13. The system of claim 12, further comprising means for displaying the sample image information as a human-viewable image.

14. The system of claim 1, wherein said computer means includes: means for storing at least one sequence of data words for controlling the characteristics of said at least one magnetic field gradient and said RF excitation signal to acquire and store information sufficient to provide selected ones of two-dimensional, three-dimensional and four-dimensional image representations of said sample; and means for storing all of the information so acquired until said information is requested.

15. The system of claim 14, further comprising means for displaying the sample image information as a human-viewable image.

* * * * *